(12) United States Patent
Tanaka

(10) Patent No.: US 10,374,188 B2
(45) Date of Patent: Aug. 6, 2019

(54) LIGHT-EMITTING DEVICE WITH AUXILIARY ELECTRODE AND ADJACENT INSULAR CONDUCTIVE PORTIONS

(71) Applicant: PIONEER CORPORATION, Tokyo (JP)

(72) Inventor: Yohei Tanaka, Kawasaki (JP)

(73) Assignee: PIONEER CORPORATION, Tokyo (JP)

(*) Notice: Subject to any disclaimer, the term of this patent is extended or adjusted under 35 U.S.C. 154(b) by 0 days.

(21) Appl. No.: 15/311,814

(22) PCT Filed: Mar. 31, 2015

(86) PCT No.: PCT/JP2015/060162
§ 371 (c)(1),
(2) Date: Nov. 16, 2016

(87) PCT Pub. No.: WO2015/174154
PCT Pub. Date: Nov. 19, 2015

(65) Prior Publication Data
US 2017/0092891 A1    Mar. 30, 2017

(30) Foreign Application Priority Data

May 16, 2014   (WO) ................. PCT/JP2014/063123

(51) Int. Cl.
*H01L 51/52* (2006.01)
*H01L 51/00* (2006.01)
*H01L 51/56* (2006.01)

(52) U.S. Cl.
CPC ...... *H01L 51/5212* (2013.01); *H01L 51/0005* (2013.01); *H01L 51/0022* (2013.01);
(Continued)

(58) Field of Classification Search
CPC .................. H01L 51/5212; H01L 51/5228
(Continued)

(56) References Cited

U.S. PATENT DOCUMENTS 6,696,699 B2   2/2004  Sugimoto et al.
7,638,807 B2  12/2009  Yukinobu
(Continued)

FOREIGN PATENT DOCUMENTS

JP   H11-339970     10/1999
JP   2002343562 A   11/2002
(Continued)

OTHER PUBLICATIONS

International Search Report and Written Opinion for PCT App No. PCT/JP2015/060162 dated Jun. 30, 2015, 12 pgs.

*Primary Examiner* — Robert T Huber
(74) *Attorney, Agent, or Firm* — Procopio, Cory, Hargreaves & Savitch LLP

(57) ABSTRACT

A light-emitting device (100) includes a substrate (110), a first electrode (120), an auxiliary electrode (124), an insular conductive layer (126), an insulating layer (170), an organic layer (130), and a second electrode (140). The first electrode (120) is formed over the substrate (110), and is formed using a transparent conductive material. The auxiliary electrode (124) is formed over the first electrode (120). The conductive layer (126) is formed over the first electrode (120), and is formed of the same material as that of the auxiliary electrode (124). The insulating layer (170) is formed over a portion of the first electrode (120), and covers the auxiliary electrode (124) and the conductive layer (126). The organic layer (130) is formed over the first electrode (120), and the second electrode (140) is formed over the organic layer (130).

8 Claims, 30 Drawing Sheets

(52) U.S. Cl.
CPC ........ *H01L 51/5203* (2013.01); *H01L 51/524* (2013.01); *H01L 51/5209* (2013.01); *H01L 51/5228* (2013.01); *H01L 51/56* (2013.01); *H01L 2251/5361* (2013.01); *H01L 2251/5369* (2013.01)

(58) Field of Classification Search
USPC .......................................... 257/40, E51.019
See application file for complete search history.

(56) References Cited

U.S. PATENT DOCUMENTS

| | | | |
|---|---|---|---|
| 7,901,538 | B2 | 3/2011 | Yukinobu |
| 8,865,394 | B2 | 10/2014 | Hartmann et al. |
| 2002/0167269 | A1 | 11/2002 | Sugimoto et al. |
| 2004/0169467 | A1 | 9/2004 | Sugimoto et al. |
| 2007/0079869 | A1 | 4/2007 | Yukinobu |
| 2008/0271843 | A1 | 11/2008 | Yukinobu |
| 2011/0180308 | A1* | 7/2011 | Nakamura .......... H01L 51/5268 174/255 |
| 2013/0146859 | A1 | 6/2013 | Hartmann et al. |
| 2013/0221341 | A1 | 8/2013 | Iwabuchi et al. |
| 2015/0287953 | A1 | 10/2015 | Ozeki et al. |

FOREIGN PATENT DOCUMENTS

| | | |
|---|---|---|
| JP | 2007073305 A | 3/2007 |
| JP | 2008-288102 | 11/2008 |
| JP | 2010-198935 | 9/2010 |
| JP | 2012-094348 | 5/2012 |
| JP | 2013-073810 | 4/2013 |
| JP | 2013-541804 | 11/2013 |
| JP | 2014072044 A | 4/2014 |
| KR | 10-2012-0012641 A | 2/2012 |
| WO | 2005041217 | 5/2005 |
| WO | 2007029756 | 3/2007 |
| WO | 2014065226 A1 | 5/2014 |

\* cited by examiner (a)

| DISTANCE L (µm) | NUMBER | RATE(%) |
|---|---|---|
| LESS THAN 30 | 0 | 0 |
| EQUAL TO OR GREATER THAN 30 AND LESS THAN 40 | 29 | 18.71 |
| EQUAL TO OR GREATER THAN 40 AND LESS THAN 50 | 97 | 62.58 |
| EQUAL TO OR GREATER THAN 50 AND LESS THAN 60 | 25 | 16.13 |
| EQUAL TO OR GREATER THAN 60 AND LESS THAN 70 | 3 | 1.94 |
| EQUAL TO OR GREATER THAN 70 AND LESS THAN 80 | 1 | 0.64 |

FIG. 29

|  | (a) | (b) | (c) |
|---|---|---|---|
| INITIAL RESISTANCE (Ω) | 11 | 4 | 19 |
| POST-TEST RESISTANCE (Ω) | 14 | 4 | 17 |
| CHANGE RATE (%) | 130 | 93 | 90 |

LIGHT-EMITTING DEVICE WITH AUXILIARY ELECTRODE AND ADJACENT INSULAR CONDUCTIVE PORTIONS

CROSS-REFERENCE TO RELATED APPLICATIONS

This application is a U.S. National Stage entry of PCT Application No. PCT/JP2015/060162, filed on Mar. 31, 2015, which claims priority to PCT Application No. PCT/JP2014/063123 filed May 16, 2014. The contents of the foregoing are incorporated by reference.

TECHNICAL FIELD

The present invention relates to a light-emitting device.

BACKGROUND ART

In recent years, there has been progress in the development of light-emitting devices including an organic electroluminescence (EL) element as a light-emitting element. The organic EL element has a configuration in which an organic layer is interposed between a first electrode which is a transparent electrode and a second electrode. A transparent conductive material is higher in resistance than a metal material such as Al. For this reason, as disclosed in, for example, Patent Documents 1 and 2, an auxiliary electrode constituted of a metal is often formed in the transparent electrode.

In Patent Document 1, examples of materials of the auxiliary electrode include Cu, Ag, and Al. In addition, in Patent Document 2, coating materials obtained by dispersing metal particles in water, alcohol or the like are exemplified as materials of the auxiliary electrode. Here, examples of the metal particles include Au, Ag, Cu, Fe, Ni, Cr, and an alloy thereof. Meanwhile, in Patent Documents 1 and 2, the auxiliary electrode and the transparent electrode are formed on a substrate in this order.

RELATED DOCUMENT

Patent Document

[Patent Document 1] Japanese Unexamined Patent Application Publication No. 2008-288102

[Patent Document 2] Japanese Unexamined Patent Application Publication No. 2013-73810

SUMMARY OF THE INVENTION

The inventor has studied forming the auxiliary electrode from a coating material, in a light-emitting device in which a first electrode which is a transparent electrode and an auxiliary electrode are formed on a substrate in this order, and the auxiliary electrode is covered with an insulating layer. At this time, the inventor has found that, when coating a region with an interconnect material, droplets of the interconnect material adhere to the periphery of the coated region, and there is thus the possibility of an insular conductive layer being formed. The presence of this insular conductive layer causes the first electrode to partially increase in thickness, and thus the thickness of an organic layer on the first electrode is not maintained in a reference range. Thereby, there is the possibility of the first electrode and a second electrode being short-circuited.

The exemplified problem to be solved by the present invention is to suppress short-circuiting between a first electrode and a second electrode when forming an auxiliary electrode from a coating material over the first electrode which is a transparent electrode.

According to the invention of claim 1, there is provided a light-emitting device including: a substrate; a first electrode, formed over the substrate, and constituted of a transparent conductive material; an auxiliary electrode formed over the first electrode; an insular conductive portion formed over the first electrode and formed of the same material as that of the auxiliary electrode; an insulating layer that covers the auxiliary electrode and the insular conductive portion, and embeds a gap between the auxiliary electrode and the insular electrode; an organic layer formed over the insulating layer and the first electrode; and a second electrode formed over the organic layer.

BRIEF DESCRIPTION OF THE DRAWINGS

The above and other objects, features and advantages will be made clearer from certain preferred embodiments described below and the following accompanying drawings.

FIG. 22 is a diagram illustrating results obtained by tallying up the number of conductive layers 126 according to each distance from the center of the auxiliary electrode 124 to the conductive layer 126.

FIG. 29 is a diagram illustrating results obtained by inspecting the resistance of the auxiliary electrode.

DESCRIPTION OF EMBODIMENTS

Figure 1:
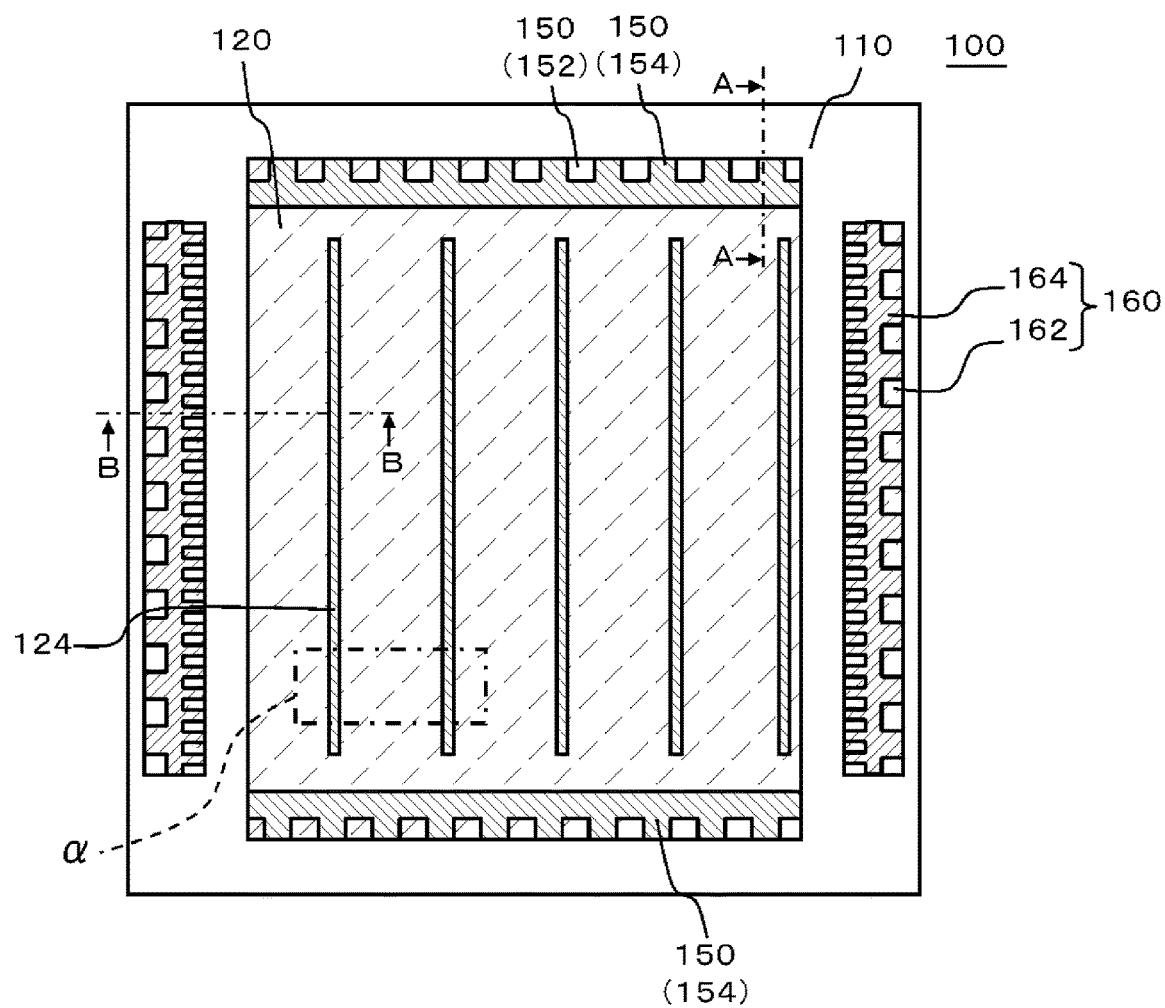
FIG. 1 is a diagram in which an organic layer and an insulating layer are removed from FIG. 2.

Hereinafter, an embodiment of the present invention will be described with reference to the accompanying drawings. In all the drawings, like elements are referenced by like reference numerals and the descriptions thereof will not be repeated.

First Embodiment

Figure 2:
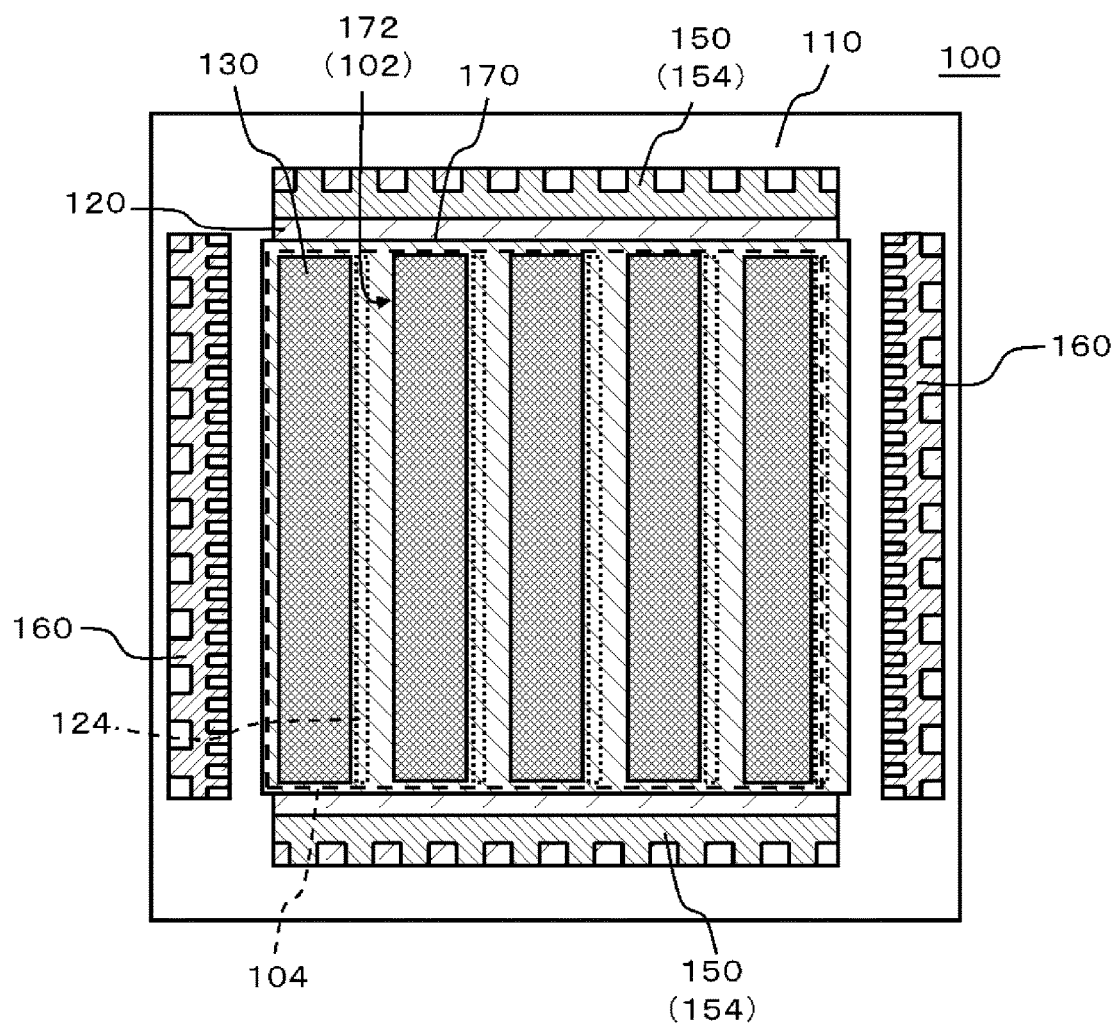
FIG. 2 is a diagram in which a second electrode is removed from FIG. 3.
Figure 3:
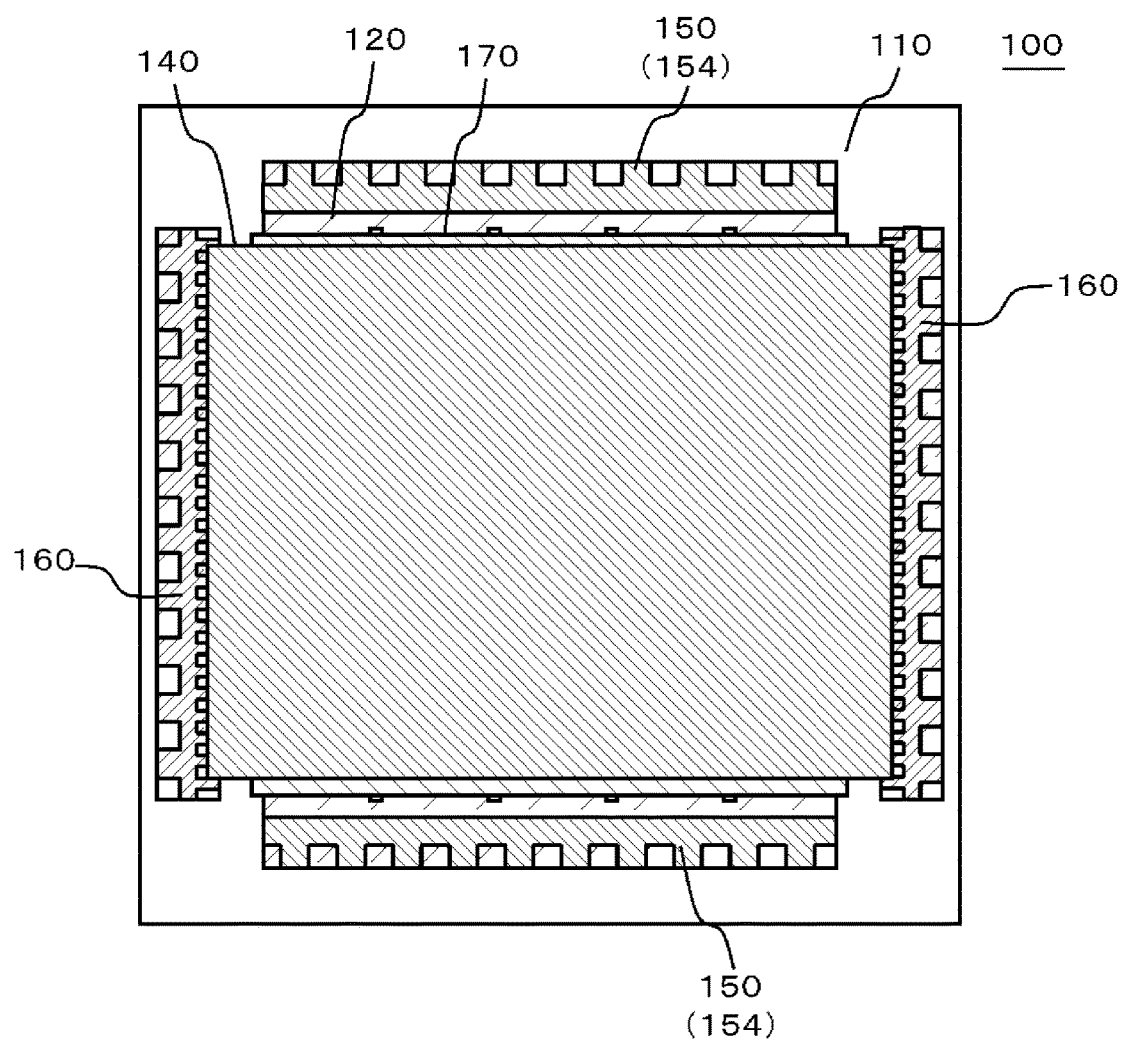
FIG. 3 is a diagram in which a sealing member is removed from FIG. 4.
Figure 4:
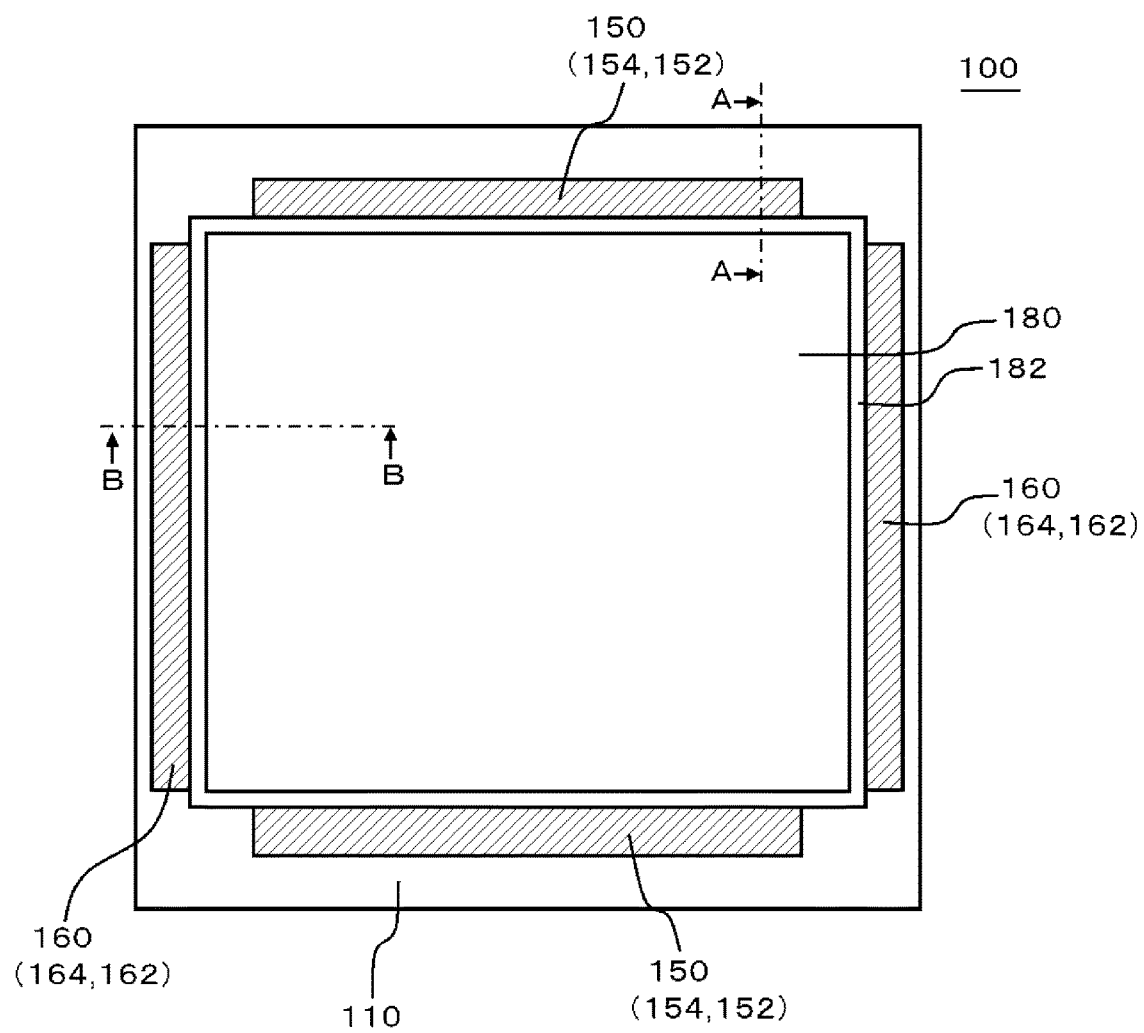
FIG. 4 is a plan view of a light-emitting device.

FIGS. 1, 2, 3, and 4 are plan views of a light-emitting device 100. FIG. 3 is a diagram in which a sealing member 180 is removed from FIG. 4, FIG. 2 is a diagram in which a second electrode 140 is removed from FIG. 3, and FIG. 1 is a diagram in which an organic layer 130 and an insulating layer 170 are removed from FIG. 2. The light-emitting device 100 shown in the drawings is used as an illumination device.

The light-emitting device 100 is polygonal such as, for example, rectangular, and includes a plurality of organic EL elements 102 (shown in FIG. 2), first terminals 150, and second terminals 160. A light-emitting portion 104 is formed by the plurality of organic EL elements 102. The light-emitting portion 104 is, for example, rectangular, and the length of its one side is, for example, equal to or greater than 45 mm and equal to or less than 105 mm. Meanwhile, the layout of respective components of the light-emitting device 100 shown below is merely an example. For example, the light-emitting device 100 may be a spontaneous emission-type display device.

The first terminal 150 and the second terminal 160 are provided for supplying power to the organic EL element 102. Therefore, a connecting member (for example, metal interconnect) for supplying power to the light-emitting device 100 is connected to the first terminal 150 and the second terminal 160. The first terminal 150 extends in a first direction (horizontal direction in the drawings), and the second terminal 160 extends in a second direction (for example, vertical direction in the drawings) intersecting the first direction.

The organic EL element 102 has a configuration in which the first electrode 120, the organic layer 130, and the second electrode 140 are laminated on the substrate 110. In the example shown in the drawings, the first electrode 120, the organic layer 130, and the second electrode 140 are laminated on the substrate 110 in this order.

The substrate 110 is a transparent substrate of, for example, glass, a resin or the like. The substrate 110 may have flexibility. In this case, the thickness of the substrate 110 is, for example, equal to or greater than 10 μm and equal to or less than 1,000 μm. In this case, the substrate 110 may be formed of any of an inorganic material and an organic material. The substrate 110 is polygonal such as, for example, rectangular. In a case where the substrate 110 is square, one side of the substrate 110 is, for example, equal to or greater than 50 mm and equal to or less than 120 mm.

The organic layer 130 includes a light-emitting layer. The organic layer 130 has a configuration in which, for example, a hole injection layer, a light-emitting layer, and an electron injection layer are laminated in this order. A hole transport layer may be formed between the hole injection layer and the light-emitting layer. In addition, an electron transport layer may be formed between the light-emitting layer and the electron injection layer. Meanwhile, the organic layer 130 may be formed by ink jet, printing, or spraying using a coating material.

The first electrode 120 functions as the anode of the organic EL element 102, and the second electrode 140 functions as the cathode of the organic EL element 102. The first electrode 120 is a transparent electrode having optical transparency. Light emitted by the organic EL element 102 is emitted to the outside through the first electrode 120. A transparent conductive material constituting the transparent electrode contains, for example, an inorganic material such as an indium tin oxide (ITO) or an indium zinc oxide (IZO), or a conductive polymer such as a polythiophene derivative.

In addition, the second electrode 140 includes a metal layer constituted of a metal selected from a first group consisting of Au, Ag, Pt, Sn, Zn, and In, or an alloy of metals selected from this first group.

More specifically, as shown in FIG. 1, the first electrode 120 is connected to the first terminal 150. The first electrode 120 is formed continuously from a region of the substrate 110 which serves as the light-emitting portion 104 to the first terminal 150. In the example shown in the drawings, the substrate 110 is rectangular, and the first terminal 150 is provided along two sides of the substrate 110 which face each other. The first electrode 120 is formed between these two sides.

In addition, as shown in FIG. 3, each second electrode 140 of the plurality of organic EL elements 102 are connected to each other. In other words, the second electrode 140 is formed as an electrode common to the plurality of organic EL elements 102. Specifically, the second electrode 140 is formed on the organic layer 130 and the insulating layer 170, and is connected to the second terminal 160. In the example shown in the drawings, the second terminal 160 is formed along two sides of the substrate 110 which face each other. The second electrode 140 is formed so as to cover a region between these two second terminals 160.

In the example shown in FIGS. 1 to 4, the first terminal 150 and the second terminal 160 are disposed outside the light-emitting portion 104. Specifically, two first terminals 150 are disposed away from each other in the second direction, and two second terminals 160 are disposed away from each other in the first direction. The light-emitting portion 104 is located between the two first terminals 150 and between the two second terminals 160. With such a configuration, since a voltage is supplied to the first electrode 120 from the two first terminals 150, and a voltage is supplied to the second electrode 140 from the two second terminals 160, it is possible to suppress the occurrence of a distribution in a voltage inside the light-emitting portion 104. Thereby, it is possible to suppress the occurrence of a distribution of luminance in the light-emitting portion 104.

More specifically, as described above, the light-emitting device 100 is rectangular. The first terminal 150 is formed along each of two sides of the light-emitting device 100 which face each other, and the second terminal 160 is formed along each of the remaining two sides of the light-emitting device 100. The plurality of organic EL elements 102 are aligned in the direction (first direction) in which the first terminal 150 extends. In the example shown in the drawings, the organic EL element 102 is rectangular, and the short side thereof is directed to a direction parallel to the first terminal 150. The length of the first terminal 150 is larger than the short side of the organic EL element 102. A conductive member, for example, a lead terminal or a bonding wire is connected to the first terminal 150 and the second terminal 160.

The first terminal 150 has a configuration in which a second layer 154 is laminated on the same layer (first layer 152) as that of the first electrode 120. The first layer 152 is formed integrally with the first electrode 120. Therefore, it is possible to shorten a distance between the first terminal 150 and the first electrode 120, and to reduce a resistance value therebetween. In addition, it is possible to narrow a non-light-emitting region which is present at the edge of the light-emitting device 100.

The second layer 154 is formed of a material having a resistance value lower than that of the first electrode 120. The second layer 154 is formed by applying a coating material containing metal particles onto the first electrode 120 and then performing firing. As a method of coating the second layer 154 onto the first electrode 120, for example, ink jet is used. In addition, the metal particle contained in the coating material is, for example, a silver particle, and its diameter is approximately several tens of nm. In other words, this metal particle is a nano-metal particle. The connecting member for supplying a voltage to the first terminal 150 is connected to the second layer 154. It is possible to reduce the resistance value of the first terminal 150 by providing the second layer 154. Meanwhile, the second layer 154 is lower in optical transparency than the first electrode 120.

In addition, the second terminal 160 has a configuration in which a second layer 164 is laminated on a first layer 162. The first layer 162 is formed of the same material as that of which the first electrode 120 is formed. However, the first layer 162 is separated from the first electrode 120. The second layer 164 is formed using the same material and method as the second layer 154. It is possible to reduce the resistance value of the second terminal 160 by providing the second layer 164.

Auxiliary electrodes 124 are in contact with the first electrode 120. In the example shown in the drawings, a plurality of auxiliary electrodes 124 are provided on the surface of the first electrode 120 which is located on the opposite side to the substrate 110, and extend in the form of a line (for example, linearly) so as to be in parallel to each other. A distance between the auxiliary electrodes 124 is, for example, equal to or greater than 0.5 mm and equal to or less than 2 mm, and is preferably equal to or greater than 0.75 mm and equal to or less than 1.25 mm. The auxiliary electrode 124 is formed of a material having a resistance value lower than that of the first electrode 120. The auxiliary electrodes 124 are formed, and thus it is possible to suppress the occurrence of a voltage drop in the in-plane of the first electrode 120. Thereby, it is possible to suppress the occurrence of a distribution in the luminance of the light-emitting device 100.

The auxiliary electrode 124 is formed using, for example, the same material and method as the second layers 154 and 164. In other words, the auxiliary electrode 124 is formed by metal particles being fired and being bonded to each other. For this reason, at least a portion of the shape of the metal particle remains in the auxiliary electrode 124. As a result, irregularities on the surface of the auxiliary electrode 124 become larger than in a case of formation by vapor phase film formation such as vapor deposition and etching.

Meanwhile, in the example shown in the drawings, the auxiliary electrodes 124 extend between two first terminals 150, but are connected directly to none of the second layers 154 of the two first terminals 150. However, the auxiliary electrodes 124 may be connected directly to any of the second layers 154.

As shown in FIG. 2, the insulating layer 170 is formed on a region of the first electrode 120 which is not covered with the second layer 154. The insulating layer 170 is formed of a photosensitive resin such as, for example, polyimide. The insulating layer 170 is provided with a plurality of openings 172. Each of the openings 172 extends in parallel to the auxiliary electrodes 124. However, the opening 172 does not overlap the auxiliary electrodes 124. Therefore, the entirety of the auxiliary electrodes 124 is covered with the insulating layer 170. In addition, the aforementioned organic layer 130 is formed at least inside the opening 172. A voltage or a current is applied between the first electrode 120 and the second electrode 140, and thus the organic layer 130 located within the opening 172 emits light. In other words, the organic EL element 102 is formed in each of the openings 172.

In addition, as shown in FIG. 4, the plurality of organic EL elements 102 are sealed by the sealing member 180. The sealing member 180 has a shape in which the entire circumference of an edge portion 182 of a metal foil or a metal plate (for example, Al foil or Al plate) having the same polygonal shape as that of the substrate 110 is pressed down. The edge portion 182 is fixed to the substrate 110 with an adhesive material, a bonding material or the like.

Figure 5:
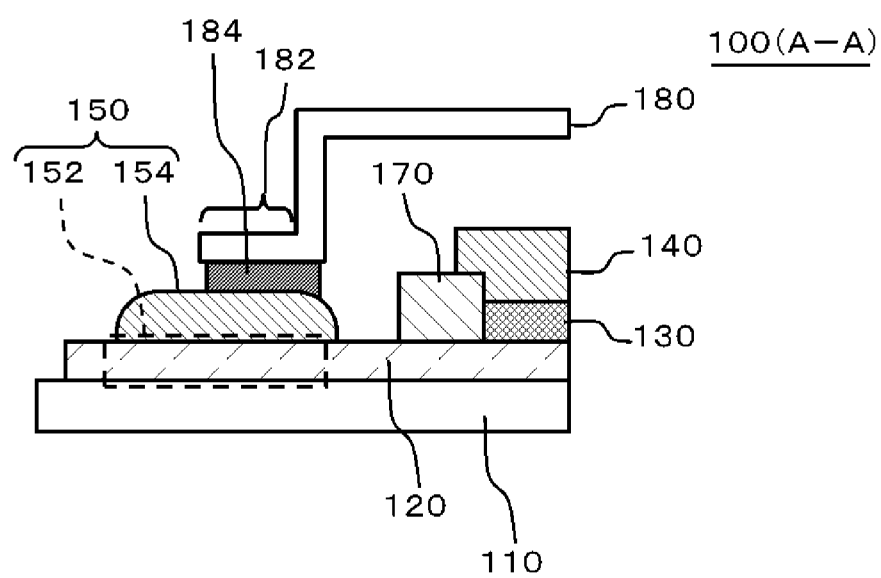
FIG. 5 is a cross-sectional view taken along line A-A of FIG. 4.

FIG. 5 is a cross-sectional view taken along line A-A of FIG. 4. As described above, the first terminal 150 has a configuration in which the second layer 154 is laminated on the end (first layer 152) of the first electrode 120. In addition, the organic layer 130 is sealed by the sealing member 180. A drying agent may be disposed inside the sealing member 180. The edge portion 182 of the sealing member 180 is fixed to the layer (second layer 154 in a cross-section A-A) formed on the substrate 110 via an insulating adhesive layer 184. However, a portion of the second layer 154 which is close to the edge of the substrate 110 is exposed from the edge portion 182. The aforementioned conductive member is connected to a portion of the second layer 154 which is exposed from the edge portion 182.

Figure 6:
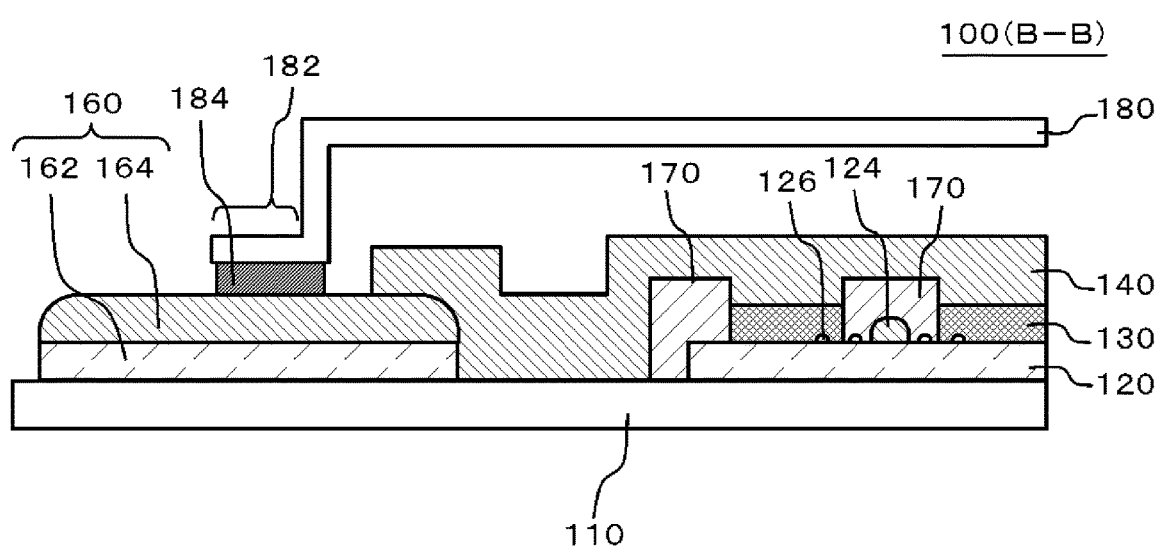
FIG. 6 is a cross-sectional view taken along line B-B of FIG. 4.

FIG. 6 is a cross-sectional view taken along line B-B of FIG. 4. As described above, the second terminal 160 has a configuration in which the second layer 164 is laminated on the first layer 162. The edge portion 182 of the sealing member 180 is fixed to a portion of the second terminal 160 via the insulating adhesive layer 184. The aforementioned conductive member is connected to a portion of the second terminal 160 which is exposed from the edge portion 182.

Figure 7:
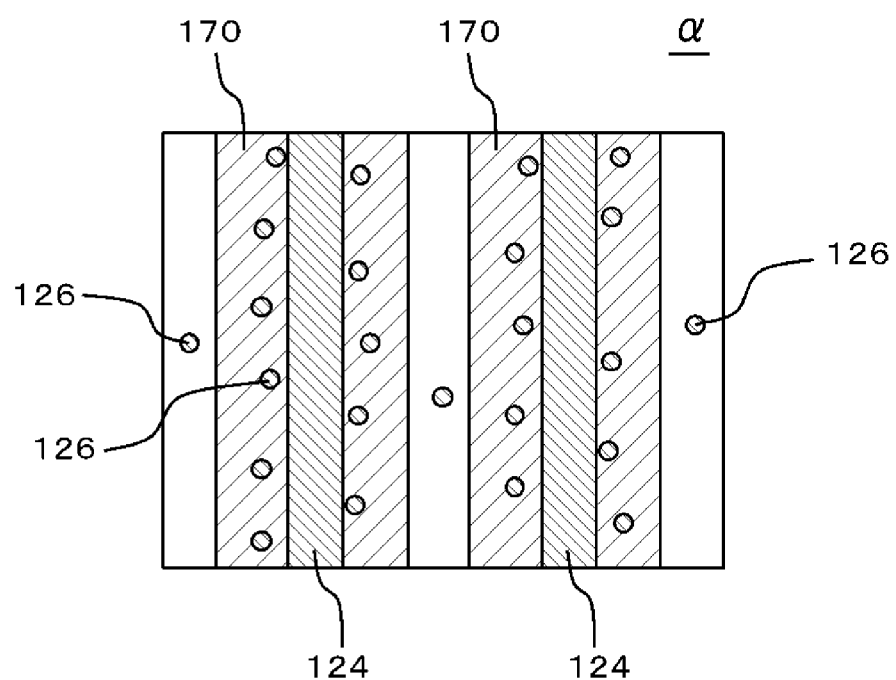
FIG. 7 is an enlarged view of a region surrounded by a dotted line α in FIG. 1.

FIG. 7 is an enlarged view of a region surrounded by a dotted line α in FIG. 1. As described above, the auxiliary electrode 124 is formed using a coating material. A coating material for forming the auxiliary electrode 124 is scattered and adhered to the periphery of the auxiliary electrode 124, forming a plurality of insular conductive layers 126 (conductive portions). In a case where the auxiliary electrode 124 is formed by ink jet, the conductive layer 126 is particularly easily formed. The conductive layer 126 is formed of the same material as that of which the auxiliary electrode 124 is formed. Therefore, the same conductive element (for example, metal such as silver) as that of the auxiliary electrode 124 is contained in the conductive layer 126. The conductive layer 126 is not connected directly to the auxiliary electrode 124. The area of one conductive layer 126 is, for example, equal to or greater than 100 nm$^2$ and equal to or less than 50 μm$^2$. On the other hand, the width of the auxiliary electrode 124 is, for example, equal to or greater than 25 μm equal to or less than 100 μm, and preferably is equal to or greater than 40 μm and equal to or less than 60 μm. The length of the auxiliary electrode 124 is, for example, equal to or greater than 10 mm and equal to or less than 200 mm, and is preferably equal to or greater than 50 mm and equal to or less than 100 mm.

The density of the conductive layer 126 at the halfway point between two auxiliary electrodes 124 next to each other is lower than the density of the conductive layer 126 in a region adjacent to the auxiliary electrode 124, in the width direction (horizontal direction in FIGS. 1 to 4, 6, and 7) of the auxiliary electrode 124. The auxiliary electrode 124 is covered with the insulating layer 170, but the width of the insulating layer 170 is designed so as to be larger than the width of the auxiliary electrode 124, in consideration of, for example, the accuracy of the placement position of the auxiliary electrode 124 and the accuracy of the placement position of the insulating layer 170. For example, the width of the insulating layer is more than twice the width of the auxiliary electrode 124. The width of the insulating layer 170 is, for example, equal to or greater than 50 μm and equal to or less than 120 μm, and is preferably equal to or greater than 90 μm and equal to or less than 110 μm. The width of the insulating layer 170 may be larger than the width of the auxiliary electrode 124 by 0.5 mm or greater. Most of the conductive layers 126 are covered with the insulating layer 170. In other words, one insulating layer 170 covers the auxiliary electrode 124 and at least one conductive layer 126. In addition, in other words, the auxiliary electrode 124 and the conductive layers 126 are covered with the insulating layer 170, gaps between the auxiliary electrode 124 and the conductive layers 126 are also embedded with the insulating layer 170. Meanwhile, the conductive layers 126 which are not covered with the insulating layer 170 are treated using a fluid as described later. This fluid insulates, increases resistance of, or etches a material constituting the conductive layer 126.

Next, a method of manufacturing the light-emitting device 100 will be described. First, a material serving as the first electrode 120 is formed on the substrate 110 using, for example, sputtering or vapor deposition. Next, this conductive layer is selectively removed using etching (for example, dry etching or wet etching) or the like. Thereby, the first electrode 120 and the first layers 152 and 162 are formed on the substrate 110 (first step).

Next, the auxiliary electrode 124 is formed on the first electrode 120, the second layer 154 is formed on the first layer 152, and the second layer 164 is further formed on the first layer 162. The auxiliary electrode 124 and the second layers 154 and 164 are formed by coating such as, for example, by ink jet (second step). In this step, a coating material for forming the auxiliary electrode 124 is scattered, thus causing the conductive layer 126 to form on the first electrode 120.

Next, an insulating layer is formed on the substrate 110 and the first electrode 120, and this insulating layer is selectively removed using a chemical solution (for example, developing solution). Thereby, the insulating layer 170 and the opening 172 are formed. In a case where the insulating layer 170 is formed of an insulating layer, the insulating layer 170 and the opening 172 are formed by exposure and development. In a case where the insulating layer 170 is formed of polyimide, the insulating layer 170 is further subjected to heat treatment, thereby promoting imidization of the insulating layer 170.

Next, the substrate 110 is treated with a fluid, that is, with a liquid or a gas. This fluid insulates (for example, oxidizes) or etches a material constituting the conductive layer 126. Thereby, at least the surface layer of the conductive layer 126 which is not covered with the insulating layer 170 is insulated (for example, oxidized) or increased in resistance, or the conductive layer 126 is removed by etching (third step). In this case, the auxiliary electrode 124 is covered with the insulating layer 170, and thus is not insulated or not etched. Meanwhile, the details of this step will be described later.

Next, the organic layer 130 is formed within the opening 172 (fourth step). At least one layer (for example, hole transport layer) constituting the organic layer 130 may be formed using coating such as, for example, by spray coating, dispenser coating, ink jet, or printing. Meanwhile, the remaining layers of the organic layer 130 are formed using, for example, vapor deposition, but these layers may also be formed by coating.

Next, the second electrode 140 is formed on the organic layer 130 using, for example, vapor deposition or sputtering (fifth step). Thereafter, the sealing member 180 is fixed to the substrate 110 using the adhesive layer 184.

Figure 8:
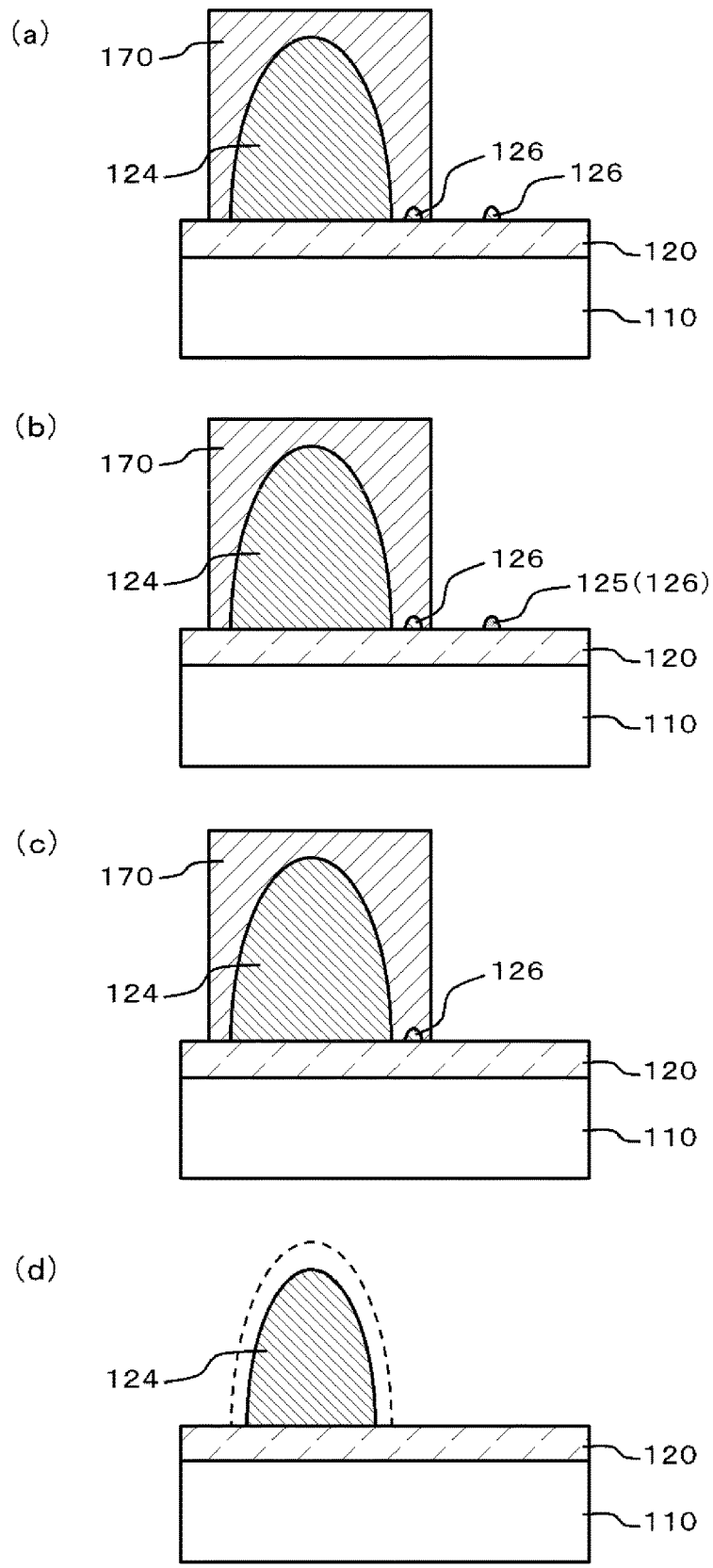
FIG. 8 are cross-sectional views illustrating steps of treating a substrate with a fluid.

FIG. 8 are cross-sectional views illustrating steps of treating the substrate 110 using a fluid. As shown in FIG. 8(*a*), the insular conductive layers 126 are formed over the substrate 110, in addition to the auxiliary electrode 124. Some of the conductive layers 126 are covered with the insulating layer 170, but the remaining conductive layer 126 is exposed from the insulating layer 170.

In a case where the substrate 110 is treated using a fluid for insulating (for example, oxidizing) a material constituting the conductive layer 126, as shown in FIG. 8(*b*), at least the surface layer of the conductive layer 126 which is not covered with the insulating layer 170 becomes an alteration layer 125, and is insulated (for example, oxidized) or increased in resistance. In a case where the conductive layer 126 is formed of silver particles, the substrate 110 is treated using an oxidizing agent such as, for example, an ozone gas. Here, the substrate 110 may be treated using an ozone gas and may be irradiated with ultraviolet rays at the same time as the ozone gas treatment. In this case, at least the surface layer of the conductive layer 126 is oxidized.

In addition, in a case where the substrate 110 is treated using an etching solution for etching a material constituting the conductive layer 126, as shown in FIG. 8(c), the conductive layer 126 which is not covered with the insulating layer 170 is removed. In a case where the conductive layer 126 is formed of silver particles, the substrate 110 is treated using, for example, an etching solution containing phosphoric acid as a main component. An etching time in this case is, for example, equal to or greater than 30 seconds and equal to less than 1 minute and 30 seconds.

Meanwhile, as shown in FIG. 8(d), the substrate 110 may be treated using a fluid for etching a material constituting the conductive layer 126, after the auxiliary electrode 124 is formed and before the insulating layer 170 is formed. In this case, the auxiliary electrode 124 also becomes slightly smaller, but there is no influence on the function of the auxiliary electrode 124.

Figure 21:
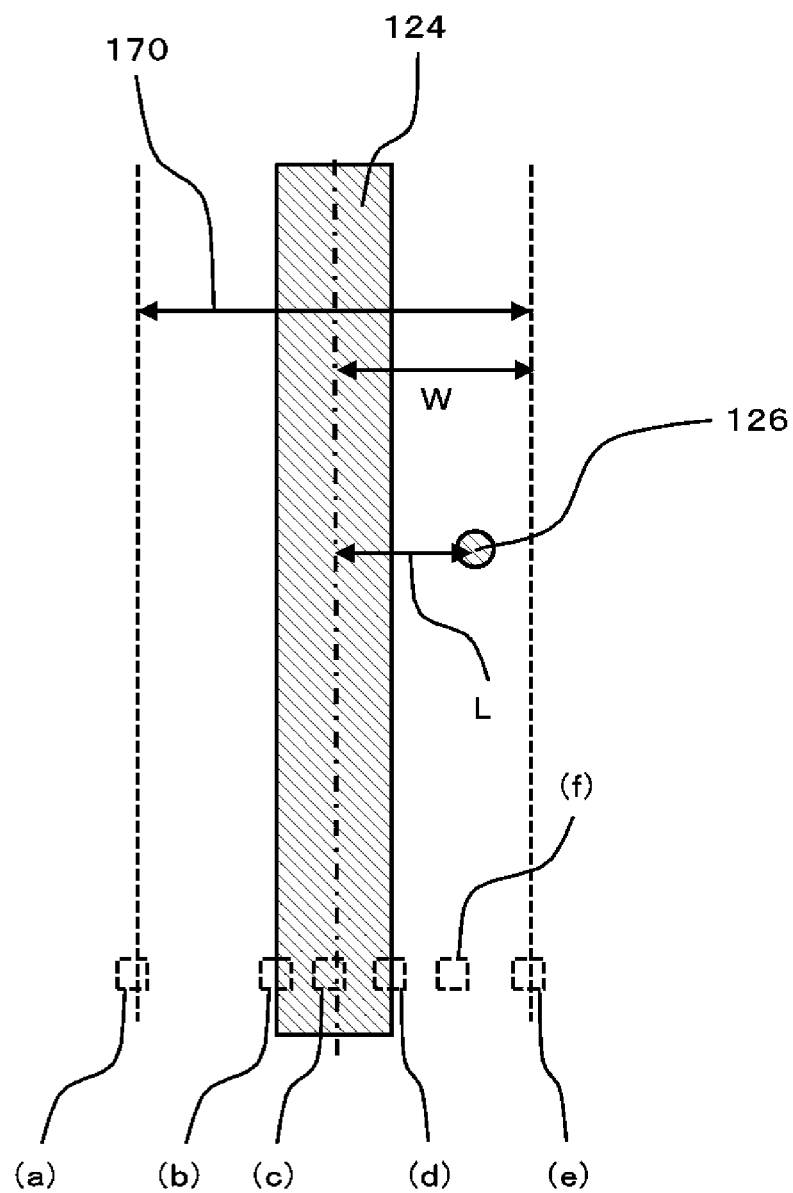
FIG. 21 is a diagram illustrating relative positions of an auxiliary electrode 124, a conductive layer 126, and an insulating layer 170.

FIG. 21 is a diagram illustrating relative positions of the auxiliary electrode 124, the conductive layer 126, and the insulating layer 170. FIG. 22 shows results obtained by tallying up the number of conductive layers 126 according to each distance L from the center of the auxiliary electrode 124 to the conductive layer 126 in the width direction of the auxiliary electrode 124. As can be seen from FIG. 22, conductive layers 126 having the distance L of less than 30 µm are hardly present. Conductive layers 126 having the distance L of equal to or greater than 30 µm and less than 50 µm occupy approximately 81% of the entirety of the conductive layers 126, and conductive layers 126 having the distance L of equal to or greater than 30 µm and less than 60 µm occupy approximately 97.4% of the entirety of the conductive layers 126. Therefore, in a case where a distance W from the center of the auxiliary electrode 124 to the edge of the insulating layer 170 is set to be equal to or greater than 40 µm and equal to or less than 60 µm, it is possible to cover most of the conductive layers 126 without excessively increasing the width of the auxiliary electrode 124.

Figure 23:
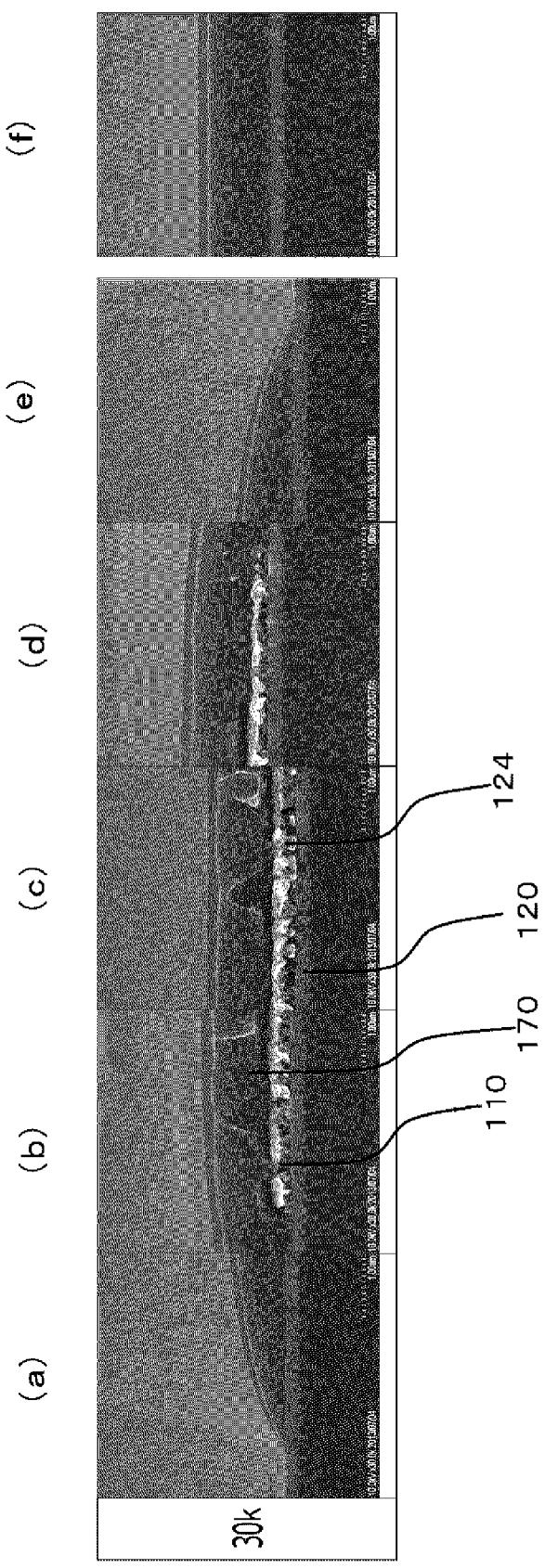
FIG. 23 is a cross-sectional SEM photograph illustrating a lamination state of a substrate 110, a first electrode 120, the auxiliary electrode 124, and the insulating layer 170.

FIG. 23 is a cross-sectional SEM photograph illustrating the lamination state of the substrate 110, the first electrode 120, the auxiliary electrode 124, and the insulating layer 170. (a), (b), (c), (d), (e), and (f) in the photograph correspond to (a), (b), (c), (d), (e), and (f) of FIG. 21, respectively. As described above, the auxiliary electrode 124 is formed by applying and heating a coating material containing metal particles. For this reason, at least a portion of the shape of metal particles remains in the auxiliary electrode 124. On the other hand, the first electrode 120 is formed using, for example, sputtering or vapor deposition. For this reason, the auxiliary electrode 124 has irregularities larger than those of the first electrode 120.

In addition, the end of the insulating layer 170 becomes gradually thinner. However, the thickness of a portion of the insulating layer 170 which overlaps the auxiliary electrode 124 is substantially constant. Therefore, the auxiliary electrode 124 is sufficiently covered with the insulating layer 170.

Figure 24:
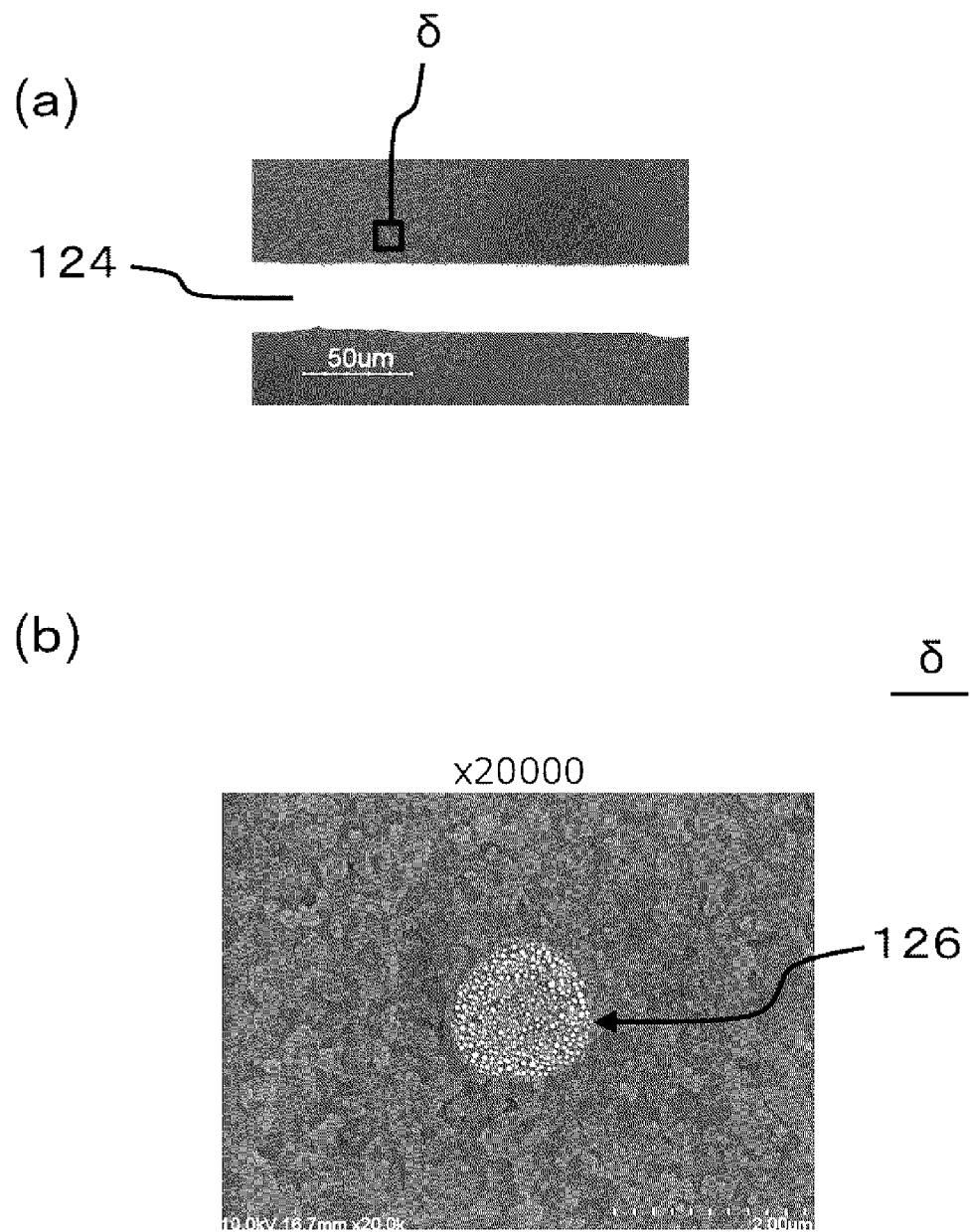
FIG. 24(a) is a photograph obtained by capturing an image of the auxiliary electrode and its periphery using an optical microscope.
FIG. 24(b) is an SEM photograph obtained by capturing an image of a portion inside the square 5 in FIG. 24(a).

FIG. 24(a) is a photograph obtained by capturing an image of the auxiliary electrode 124 and its periphery using an optical microscope. FIG. 24(b) is an SEM photograph obtained by capturing an image of a portion inside the square 5 in FIG. 24(a). From these photographs, it can be understood that the conductive layer 126 is formed in a portion separated from the auxiliary electrode 124. Meanwhile, the size of the conductive layer 126 is not limited to the example shown in FIG. 24(b), and may be smaller than that.

As stated above, according to the present embodiment, since the auxiliary electrode 124 is formed using a coating material, the insular conductive layer 126 is formed in the periphery of the auxiliary electrode 124. In a case where the conductive layer 126 remains as it is, the organic layer 130 becomes thinner in a region overlapping the conductive layer 126, and thus there is the possibility of the first electrode 120 and the second electrode 140 being short-circuited via the conductive layer 126. On the other hand, in the present embodiment, since the conductive layer 126 is covered with the insulating layer 170, it is possible to prevent the first electrode 120 and the second electrode 140 from being short-circuited due to the conductive layer 126.

In addition, the auxiliary electrode 124 and the conductive layer 126 are covered with the insulating layer 170, and a gap between the auxiliary electrode 124 and the conductive layer 126 is also embedded with the insulating layer 170. Therefore, as compared to a case where the insulating layer 170 covering the conductive layer 126 and the insulating layer 170 covering the auxiliary electrode 124 are formed separately, it is possible to reduce the number of steps of manufacturing the light-emitting device 100.

In addition, even in a case where a conductive layer 126 which is not covered with the insulating layer 170 is present, this conductive layer 126 is removed by etching, or at least the surface layer of this conductive layer 126 is insulated or increased in resistance. Therefore, it is possible to further prevent the first electrode 120 and the second electrode 140 from being short-circuited due to the conductive layer 126.

Figure 25:
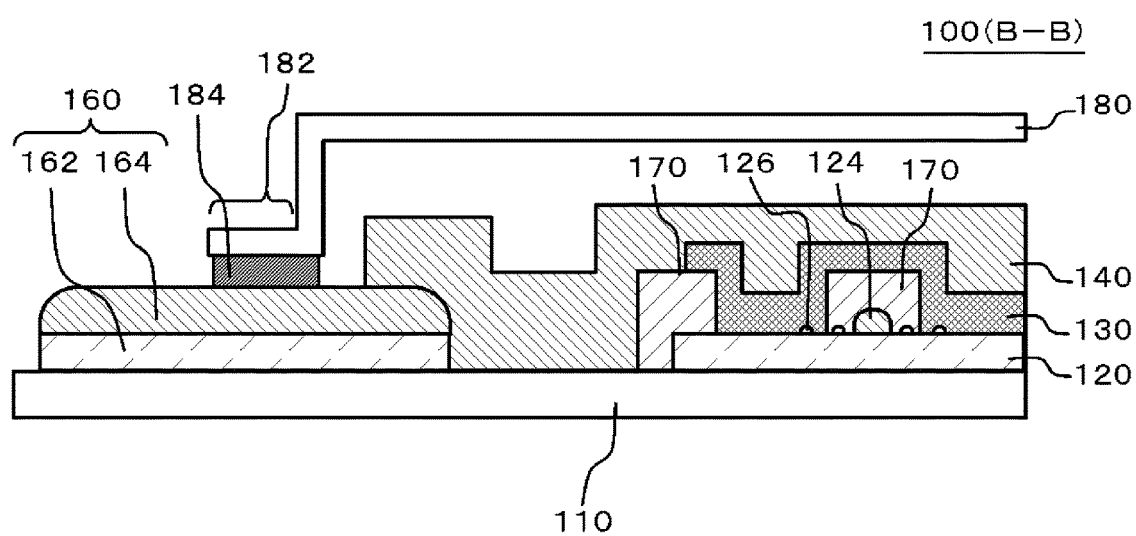
FIG. 25 is a cross-sectional view illustrating a modification example of FIG. 6.

Meanwhile, as shown in FIG. 25, the organic layer 130 may be formed on at least a portion of the upper surface and the lateral side of the insulating layer 170 covering the auxiliary electrode 124.

Modification Example of First Embodiment

Figure 9:
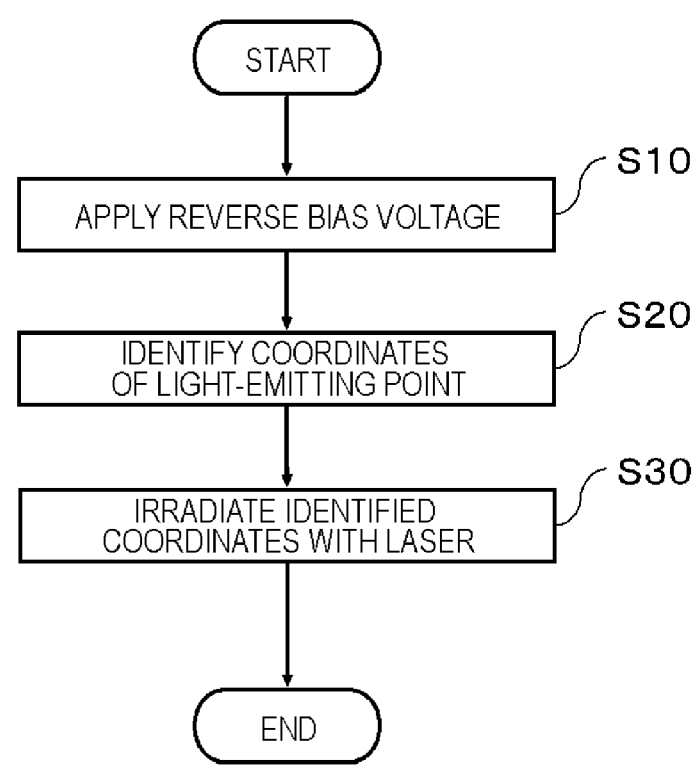
FIG. 9 is a flow diagram illustrating a method of manufacturing a light-emitting device according to a modification example of a first embodiment.

A method of manufacturing a light-emitting device 100 according to the present modification example is the same as the method of manufacturing the light-emitting device 100 according to the first embodiment, except that a repairing step shown in FIG. 9 is included instead of the step of etching the substrate 110 after the auxiliary electrode 124 is formed. The step shown in FIG. 9 may be performed after the second electrode 140 is formed and before the sealing member 180 is fixed to the substrate 110, and the repairing step may be performed after the sealing member 180 is fixed thereto.

In this repairing step, first, the position of the conductive layer 126 which is not covered with the insulating layer 170 is specified (steps S10 and S20 of FIG. 9). Specifically, a voltage in an opposite direction to that during light emission is applied between the first electrode 120 and the second electrode 140 (step S10). The absolute value of the voltage applied in this case is smaller than the absolute value of a voltage (for example, 12 V to 15 V) when the light-emitting device 100 is caused to emit light, and is, for example, equal to or higher than 1.5 V and equal to or lower than 3 V. Next, a light-emitting point is observed using, for example, an emission microscope, and the coordinates of the light-emitting point on the substrate 110 are recognized (step S20). This light-emitting point occurs by the first electrode 120 and the second electrode 140 being short-circuited due to the conductive layer 126.

Next, the coordinates recognized in the substrate 110 is irradiated with a laser (step S30). Thereby, the conductive layer 126 is removed or insulated (or increased in resistance). For this reason, a portion in which the first electrode 120 and the second electrode 140 are short-circuited is eliminated.

Figure 10:
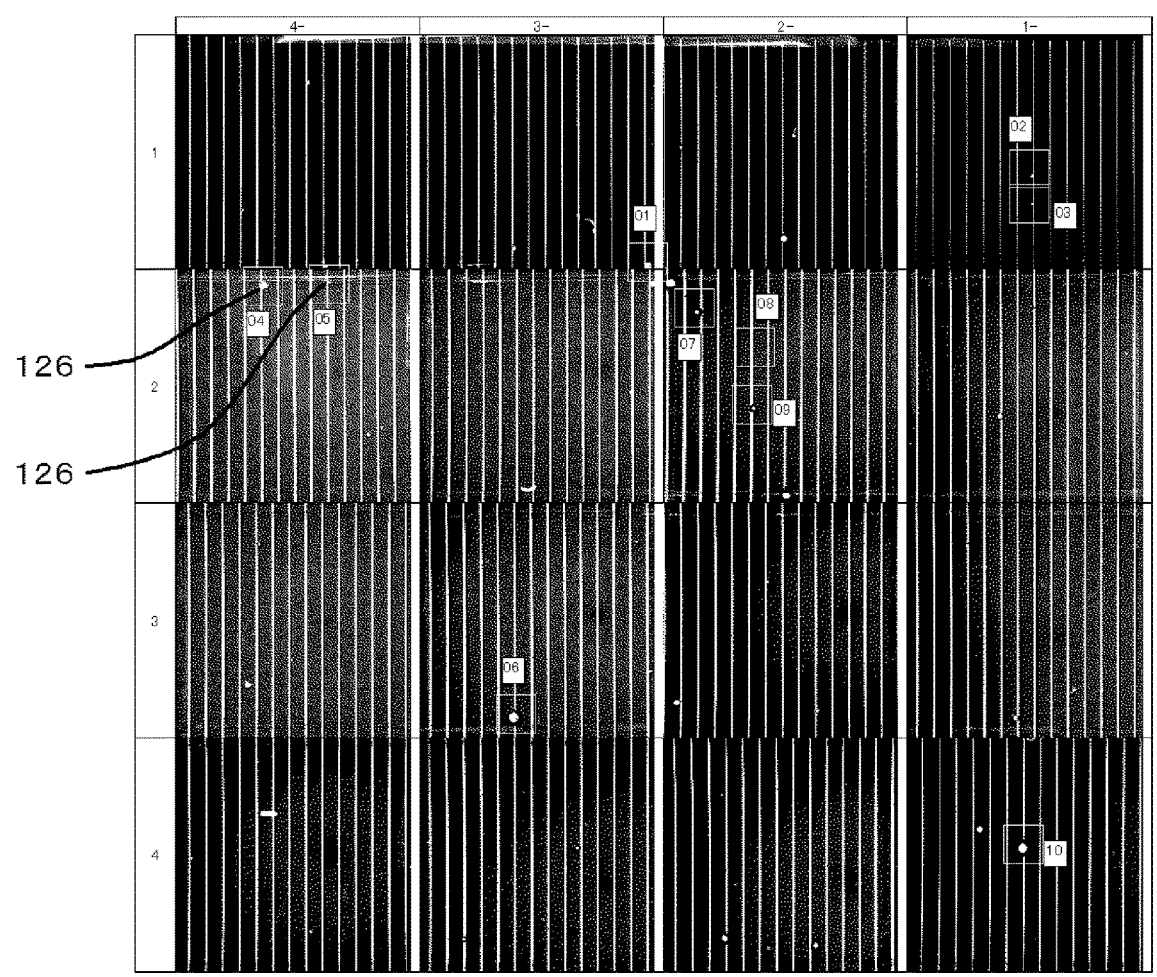
FIG. 10 is an image when the light-emitting device is observed using an emission microscope.

FIG. 10 shows an image when the light-emitting device 100 is observed using an emission microscope in a state where a voltage in an opposite direction to that during light emission is applied between the first electrode 120 and the second electrode 140. The drawing was obtained by separately capturing the light-emitting portion 104 multiple times and connecting the generated plural images. In the example shown in FIG. 10, a plurality of light-emitting points are present in the light-emitting portion 104. When treatments shown in FIG. 9 are performed on these light-emitting points, it is possible to eliminate portions in which the first electrode 120 and the second electrode 140 are short-circuited.

As stated above, according to the present modification example, the position of the conductive layer 126 which is not covered with the insulating layer 170 is specified, and then the conductive layer 126 is irradiated with a laser. Thereby, it is possible to restore the portion in which the first electrode 120 and the second electrode 140 are short-circuited due to the conductive layer 126. Therefore, the emission quality of the light-emitting device 100 is improved.

Second Embodiment

Figure 11:
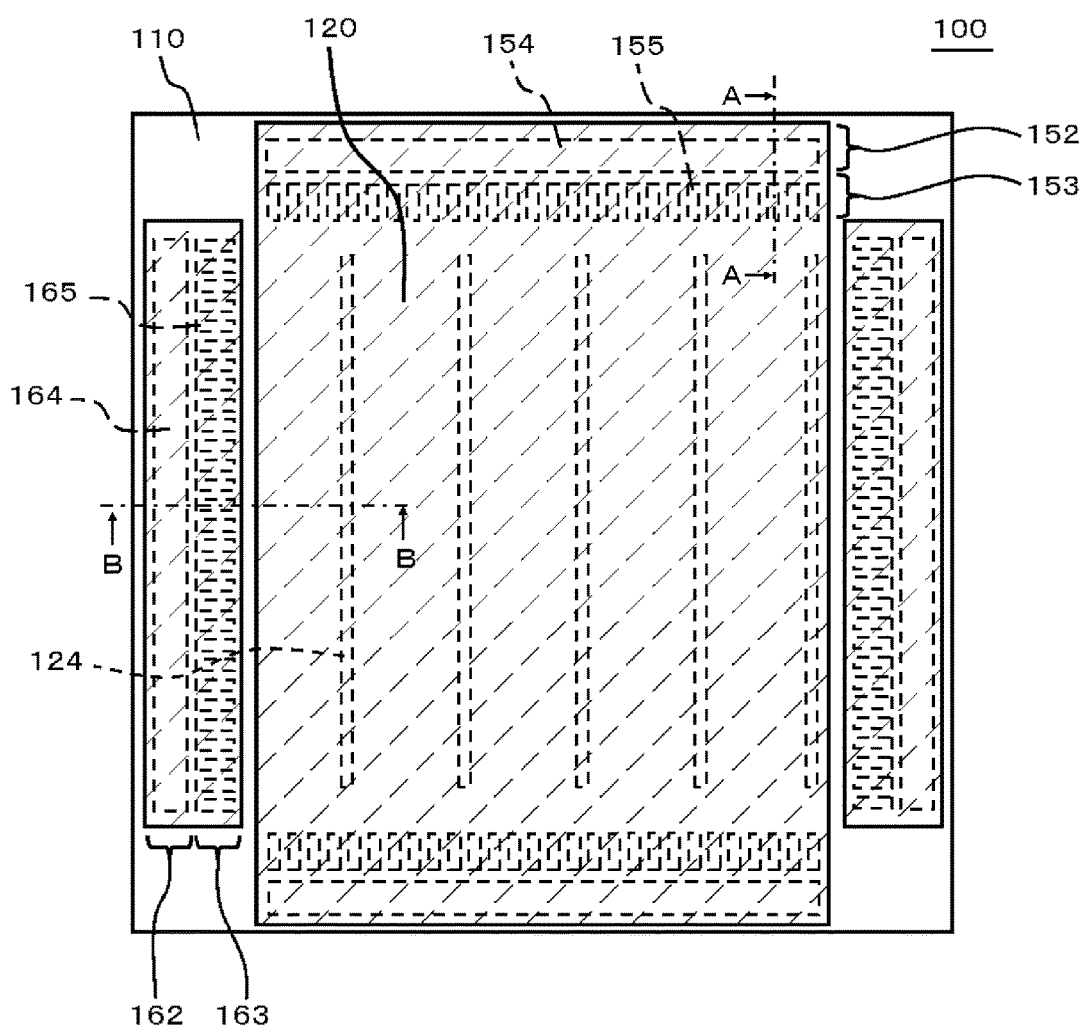
FIG. 11 is a plan view illustrating a configuration of a light-emitting device according to a second embodiment.
Figure 12:
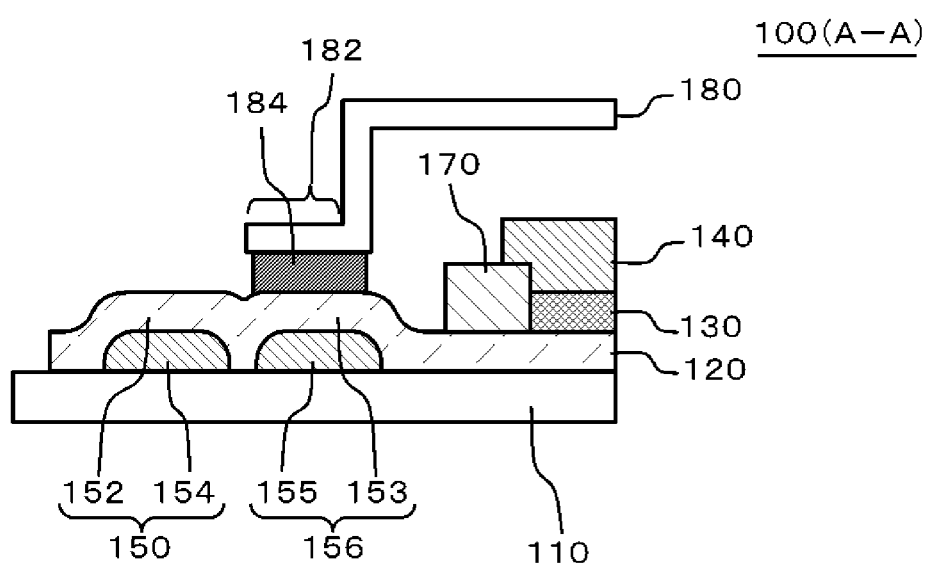
FIG. 12 is a cross-sectional view taken along line A-A of FIG. 11.
Figure 13:
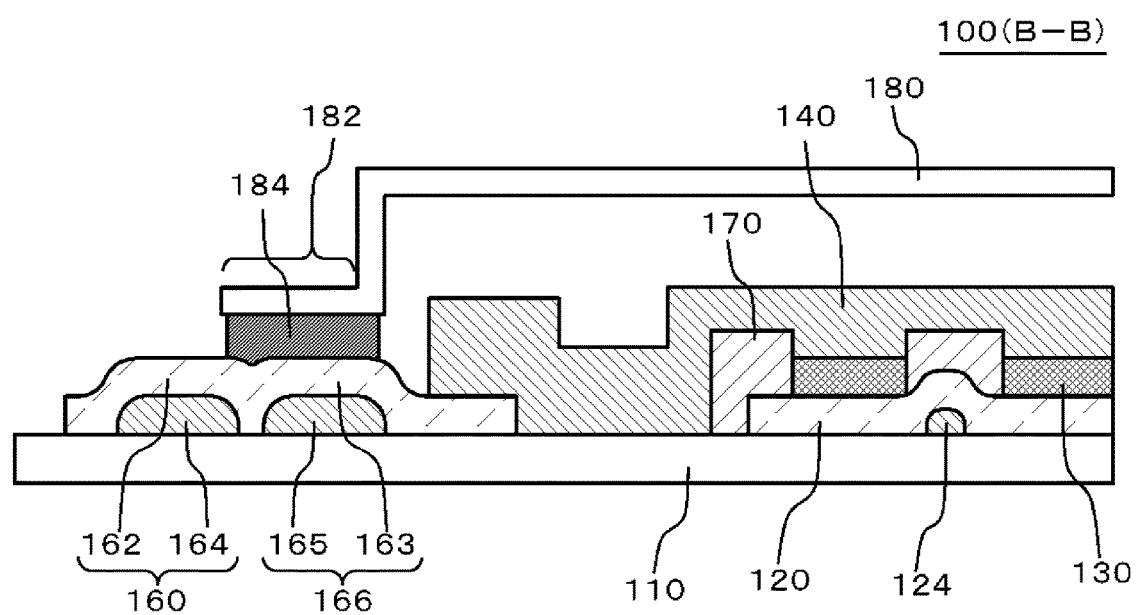
FIG. 13 is a cross-sectional view taken along line B-B of FIG. 11.

FIG. 11 is a plan view illustrating a configuration of a light-emitting device 100 according to a second embodiment, and corresponds to FIG. 1 in the first embodiment. FIG. 12 is a cross-sectional view taken along line A-A of FIG. 11, and FIG. 13 is a cross-sectional view taken along line B-B of FIG. 11. In FIGS. 12 and 13, the sealing member 180 and the adhesive layer 184 are shown for the purpose of description. The light-emitting device 100 according to the present embodiment has the same configuration as that of the light-emitting device 100 according to the first embodiment, except for the following points.

First, the auxiliary electrodes 124 are formed on the substrate 110. The first electrode 120 is formed on the substrate 110 and auxiliary electrode 124. In other words, the entirety of the auxiliary electrodes 124 is located between the substrate 110 and the first electrode 120. In addition, the insular conductive layers 126 shown in the first embodiment are also located between the substrate 110 and the first electrode 120. Here, since the auxiliary electrode 124 is formed by coating, the edge of the auxiliary electrode 124 is rounded as compared to a case of being formed using vapor phase film formation such as vapor deposition and etching. Therefore, even in a case where irregularities occur on the surface of the first electrode 120 due to the auxiliary electrodes 124 or the conductive layers 126, such irregularities become smooth.

In addition, a first connection interconnect 156 that connects the first electrode 120 to the first terminal 150 has a laminated structure of an auxiliary interconnect 155 and a transparent electrode layer 153. Since the auxiliary interconnect 155 is formed in the same step as that in which the auxiliary electrode 124 is formed, the auxiliary interconnect is formed on the substrate 110, and is formed of the same material as that of which the auxiliary electrode 124 is formed. The transparent electrode layer 153 is formed integrally with the first electrode 120 and the first layer 152 of the first terminal 150 and is larger in width than the auxiliary interconnect 155. In the example shown in FIG. 11, the width of the transparent electrode layer 153 is substantially the same as the width of the first electrode 120. A plurality of auxiliary interconnects 155 are formed below the transparent electrode layer 153 in parallel to each other.

Meanwhile, in the example shown in FIG. 11, the auxiliary interconnect 155 is separated from the second layer 154 of the first terminal 150. However, the auxiliary interconnect 155 and the second layer 154 may be connected to each other.

Further, a second connection interconnect 166 that connects the second electrode 140 to the second terminal 160 has a laminated structure of an auxiliary interconnect 165 and a transparent electrode layer 163. Since the auxiliary interconnect 165 is formed in the same step as that in which the auxiliary electrode 124 is formed similarly to the auxiliary interconnect 155, the auxiliary electrode is formed on the substrate 110, and is formed of the same material as that of which the auxiliary electrode 124 is formed. The transparent electrode layer 163 is formed integrally with the first layer 162 of the second terminal 160, and is larger in width than the auxiliary interconnect 155. In the example shown in the drawings, the width of the transparent electrode layer 163 is substantially the same as the width of the first electrode 120. A plurality of auxiliary interconnects 165 are formed below the transparent electrode layer 163 in parallel to each other. Meanwhile, in the example shown in FIG. 11, the auxiliary interconnect 165 is separated from the second layer 164 of the second terminal 160. However, the auxiliary interconnect 165 and the second layer 164 may be connected to each other.

Since the auxiliary interconnects 155 and 165 are formed by coating, the lateral sides of the auxiliary interconnects 155 and 165 are inclined in a direction in which the widths of the auxiliary interconnects 155 and 165 increase toward the bottom, as compared to a case where the auxiliary interconnects 155 and 165 are formed using vapor phase film formation such as vapor deposition and etching. Therefore, gaps hardly occur between the lateral sides of the auxiliary interconnects 155 and 165, and the transparent electrode layers 153 and 163.

The adhesive layer 184 and the edge portion 182 of the sealing member 180 are located over the first connection interconnect 156 and the second connection interconnect 166. In addition, the first connection interconnect 156 and the second connection interconnect 166 intersect the edge of the edge portion 182 on the outer circumferential side. Here, the auxiliary interconnect 155 is located below the transparent electrode layer 153 in the first connection interconnect 156, and the auxiliary interconnect 165 is located below the transparent electrode layer 163 in the second connection interconnect 166. The width of the transparent electrode layer 153 is larger than the width of the auxiliary interconnect 155, and the width of the transparent electrode layer 163 is larger than the width of the auxiliary interconnect 165. Therefore, irregularities on the underlying base of the adhesive layer 184 decrease, as compared to a case where the auxiliary interconnect 155 is formed on the transparent electrode layer 153, and the auxiliary interconnect 165 is formed on the transparent electrode layer 163. Therefore, a space between the substrate 110 and the sealing member 180 is easily embedded with the adhesive layer 184. As a result, sealability of the sealing member 180 is improved.

Further, in the present embodiment, the auxiliary interconnects 155 and 165 are formed using a coating material. Therefore, even in a case where irregularities occur on the surfaces of the transparent electrode layers 153 and 163 due to the auxiliary interconnects 155 and 165, such irregularities become smooth. For this reason, the space between the substrate 110 and the sealing member 180 is further easily embedded with the adhesive layer 184. As a result, sealability based on the sealing member 180 is further improved. In addition, since the first connection interconnect 156 is provided with the auxiliary interconnect 155, and further, the second connection interconnect 166 is provided with the auxiliary interconnect 165, the resistances of the first connection interconnect 156 and the second connection interconnect 166 are reduced.

In addition, when the auxiliary electrode 124 is formed, the insular conductive layer 126 shown in the first embodiment may be formed. However, in the present embodiment, the first electrode 120 is formed on the auxiliary electrode 124. The first electrode 120 has a certain amount of thickness, and is formed by vapor deposition or sputtering. Therefore, irregularities due to the conductive layer 126 are not likely to be formed on the upper surface of the first electrode 120. Therefore, it is possible to prevent the first electrode 120 and the second electrode 140 from being short-circuited due to the conductive layer 126.

Figure 26:
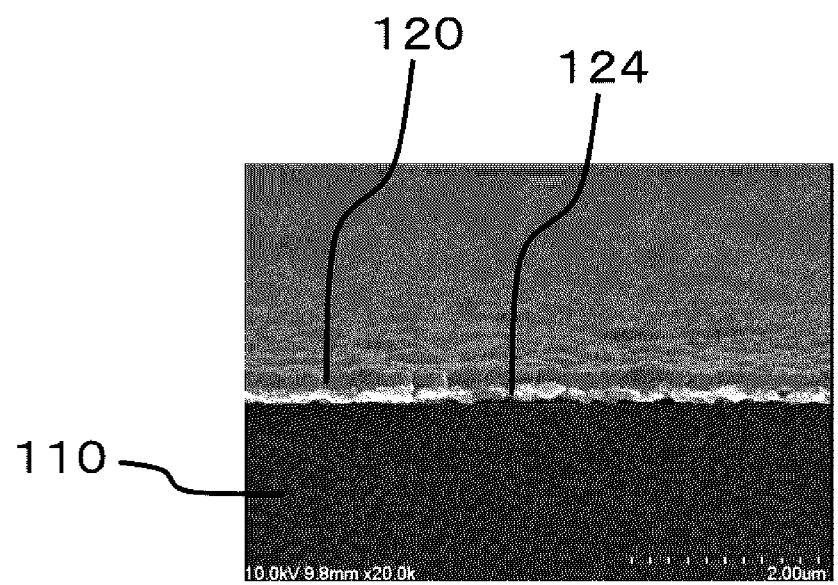
FIG. 26 is a cross-sectional SEM photograph of a laminated structure of the substrate 110, the auxiliary electrode 124, and the first electrode 120.

FIG. 26 is a cross-sectional SEM photograph of a laminated structure of the substrate 110, the auxiliary electrode 124, and the first electrode 120. In a case where the substrate 110 is formed of glass, and the auxiliary electrode 124 is formed using a coating material, adhesiveness between the substrate 110 and the auxiliary electrode 124 is not so satisfactory. For this reason, the auxiliary electrode 124 floats from the substrate 110, and as a result, there is the possibility of the resistance of the auxiliary electrode 124 increasing. On the other hand, the first electrode 120 is formed on the auxiliary electrode 124 and the substrate 110. In a case where the first electrode 120 is formed of IZO, ITO or the like, adhesiveness between the substrate 110 formed of glass and the first electrode 120 is high. Therefore, the auxiliary electrode 124 is not likely to be detached from the substrate 110.

Figure 27:
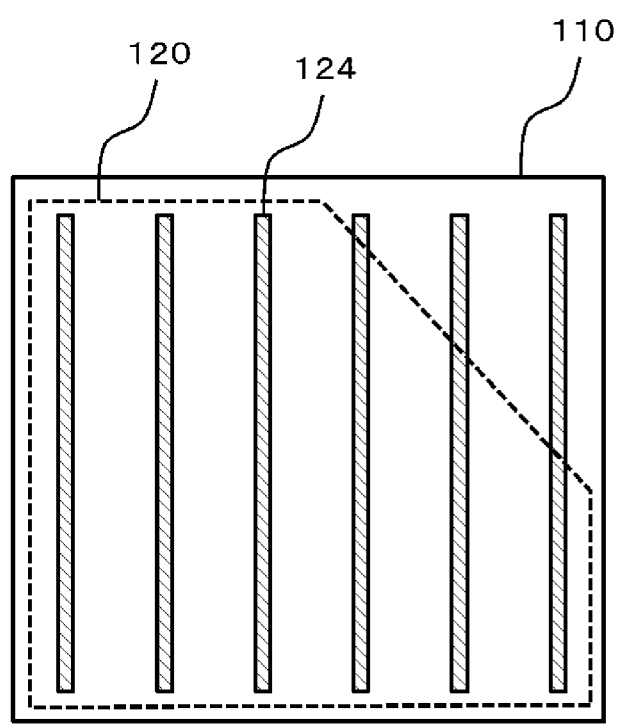
FIG. 27 is a plan view illustrating a configuration of a sample obtained by inspecting the adhesiveness of the auxiliary electrode.

FIG. 27 is a plan view illustrating a configuration of a sample in which the auxiliary electrode 124 is formed on the substrate 110, and the first electrode 120 is partially formed thereon. When an adhesive tape was attached to this sample, and the adhesive tape was peeled off, the first electrode 120 and the auxiliary electrode 124 located thereunder were not detached from the substrate 110, but a portion of the auxiliary electrode 124 which is not covered with the first electrode 120 was detached. From this, it can be understood that the auxiliary electrode 124 is not likely to be peeled off from the substrate 110 by covering the auxiliary electrode 124 with the first electrode 120.

Figure 28:
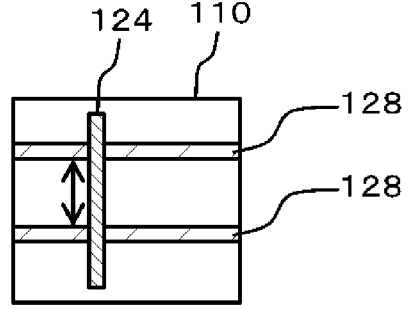
FIG. 28 are plan views illustrating configurations of samples obtained by inspecting the resistance of the auxiliary electrode.
Figure 28:
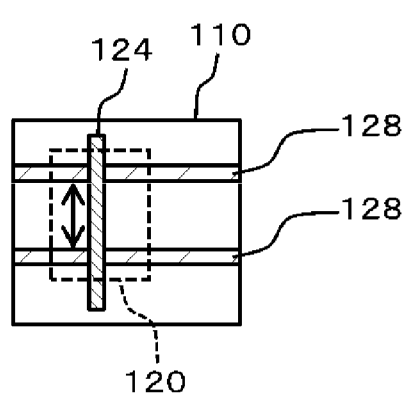
Figure 28:
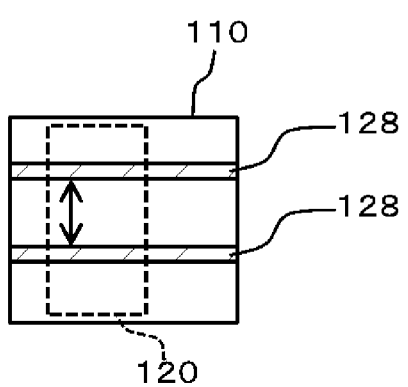

Next, the resistance of the auxiliary electrode 124 when the auxiliary electrode 124 is covered with the first electrode 120 will be described. FIG. 28 are diagrams illustrating configurations of three samples when the resistance of the auxiliary electrode 124 was inspected. The three samples shown in FIG. 28 all have a configuration in which two interconnects 128 constituted of the same transparent electrode material as that of the first electrode 120 are provided on the substrate 110 in parallel to each other. In the example shown in FIG. 28(a), the auxiliary electrode 124 is formed so as to straddle these two interconnects 128. The first electrode 120 is not formed on the auxiliary electrode 124. On the other hand, in the example shown in FIG. 28(b), the first electrode 120 is formed on the auxiliary electrode 124, in addition to the configuration shown in FIG. 28(a). The first electrode 120 also covers a contact between the auxiliary electrode 124 and the interconnect 128. In addition, in the example shown in FIG. 28(c), the auxiliary electrode 124 is not formed between the two interconnects 128, and only the first electrode 120 is formed therebetween.

FIG. 29 shows results obtained by inspecting a resistance value between two interconnects 128 in the three samples shown in FIG. 28. In all the samples, two values of an initial resistance value (initial resistance) and a resistance value (post-test resistance) after being left to stand in the atmosphere for 500 hours in a state of being heated at 85° C. are measured. In the sample shown in FIG. 28(a), the post-test resistance value is approximately 30% higher than the initial resistance. It is presumed that this is because the auxiliary electrode 124 has been detached from the substrate 110. On the other hand, in the sample shown in FIG. 28(b), the post-test resistance value is substantially the same as or slightly lower than the initial resistance. It is presumed that this is because the auxiliary electrode 124 is pressed against the substrate 110 by the first electrode 120, and was not detached from the substrate 110. Meanwhile, in the sample shown in FIG. 28(c), the post-test resistance value is also substantially the same as or slightly lower than the initial resistance. However, since the auxiliary electrode 124 is not formed, the resistance value itself is higher than those of both the sample shown in FIG. 28(a) and the sample shown in FIG. 28(b).

Figure 30:
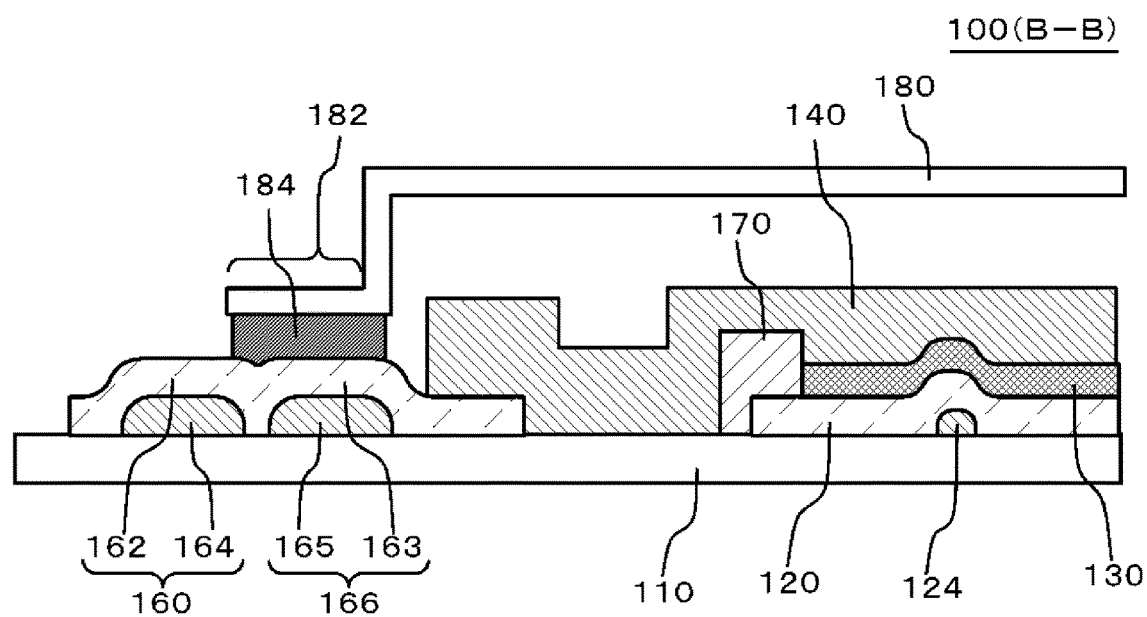
FIG. 30 is a cross-sectional view illustrating a modification example of FIG. 13.

Meanwhile, as shown in FIG. 30, in the present embodiment, a portion overlapping the auxiliary electrode 124 may not be provided with the insulating layer 170.

Modification Example 1 of Second Embodiment

Figure 14:
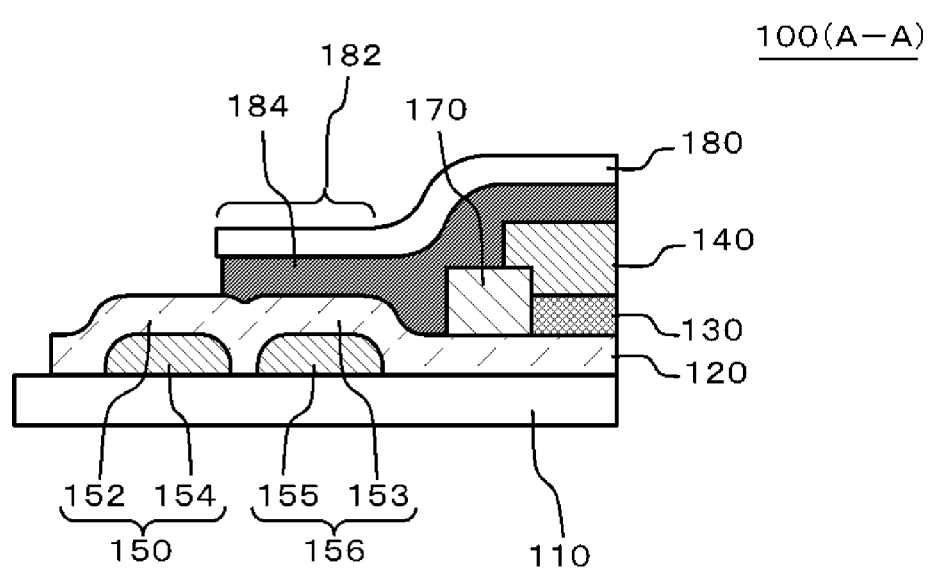
FIG. 14 is a cross-sectional view of a light-emitting device according to Modification Example 1 of the second embodiment.
Figure 15:
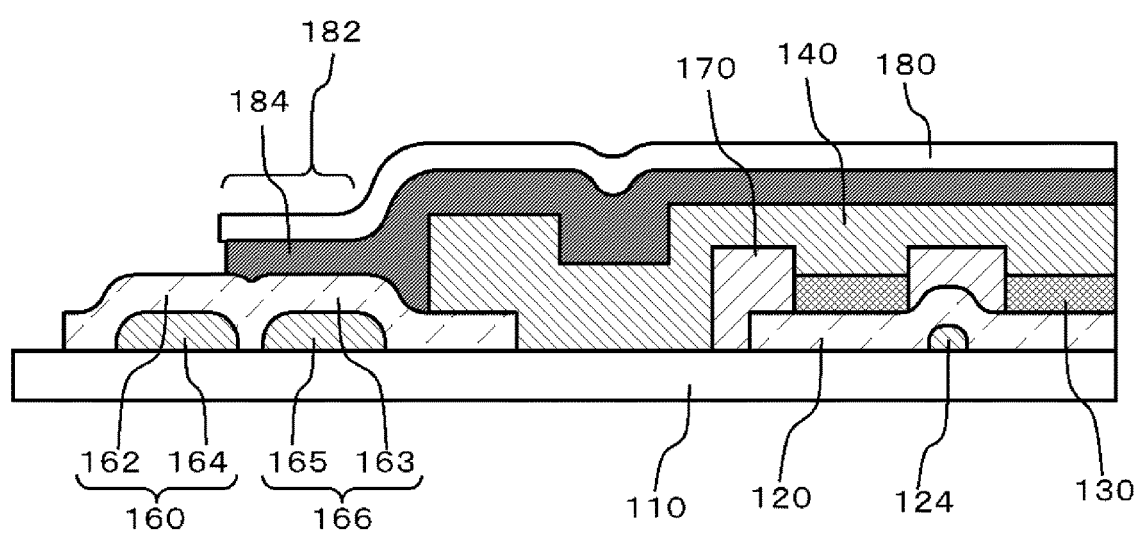
FIG. 15 is a cross-sectional view of the light-emitting device according to Modification Example 1 of the second embodiment.

FIGS. 14 and 15 are cross-sectional views of a light-emitting device 100 according to Modification Example 1, and correspond to FIGS. 12 and 13 of the second embodiment, respectively. The light-emitting device 100 according to the present modification example has the same configuration as that of the light-emitting device 100 according to the second embodiment, except for the configuration of the sealing member 180.

In the present modification example, the sealing member 180 is a sealing member having a laminate structure, and is formed by a metal thin plate or a metal foil. The adhesive layer 184 is provided substantially over the entire surface of the sealing member 180.

In the present modification example, as is the case with the second embodiment, the space between the substrate 110 and the sealing member 180 is easily embedded with the adhesive layer 184. Therefore, sealability of the sealing member 180 is improved.

Modification Example 2 of Second Embodiment

Figure 16:
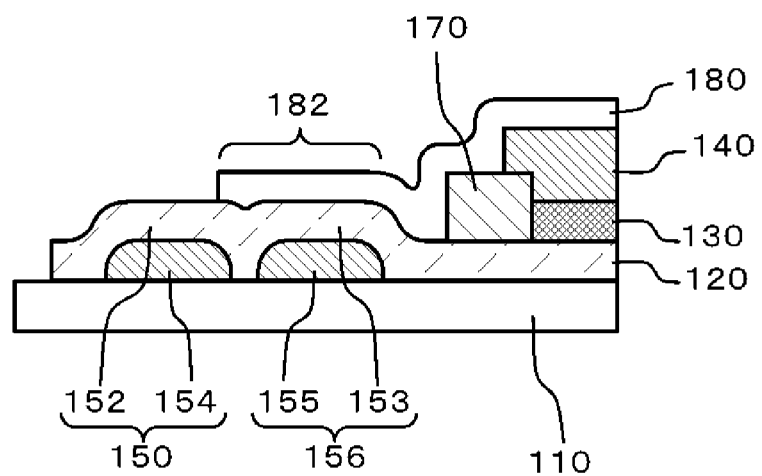
FIG. 16 is a cross-sectional view of a light-emitting device according to Modification Example 2 of the second embodiment.
Figure 17:
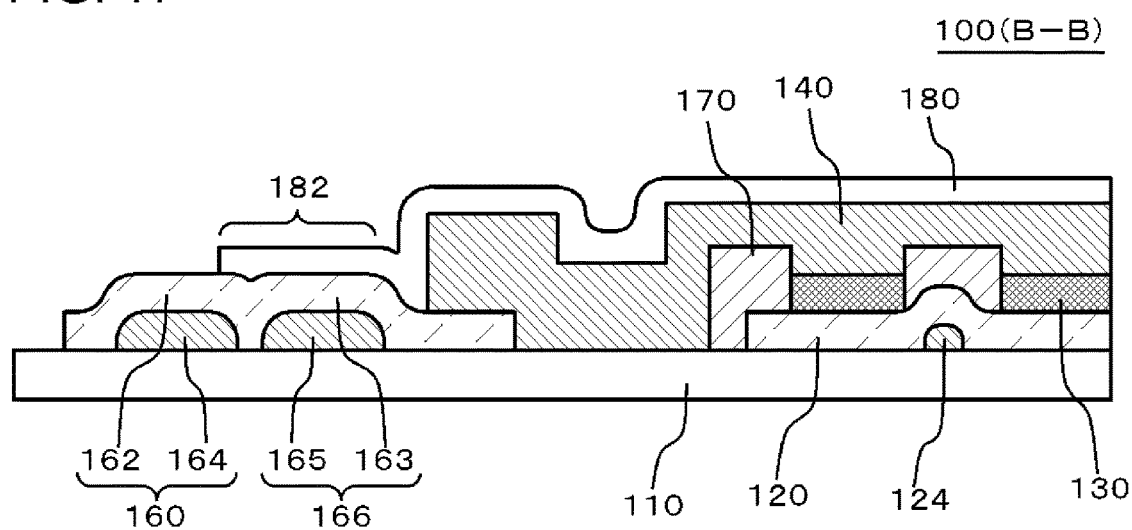
FIG. 17 is a cross-sectional view of the light-emitting device according to Modification Example 2 of the second embodiment.

FIGS. 16 and 17 are cross-sectional views of a light-emitting device 100 according to Modification Example 2, and correspond to FIGS. 12 and 13 of the second embodiment, respectively. The light-emitting device 100 according to the present modification example has the same configuration as that of the light-emitting device 100 according to the second embodiment, except that the sealing member 180 is a film.

In the present modification example, the sealing member 180 is, for example, an aluminum oxide film, and is formed using, for example, atomic layer deposition (ALD). The sealing member 180 may be formed using film formation other than ALD, for example, CVD.

Also in the present modification example, the auxiliary interconnect 155 is located below the transparent electrode layer 153 in the first connection interconnect 156, and the auxiliary interconnect 165 is located below the transparent electrode layer 163 in the second connection interconnect 166. Therefore, irregularities on the underlying base on which the adhesive layer 184 is disposed decrease as compared to a case where the auxiliary interconnect 155 is formed on the transparent electrode layer 153, and the auxiliary interconnect 165 is formed on the transparent electrode layer 163. In addition, in the present modification example, the auxiliary interconnects 155 and 165 are formed of a coating material. Therefore, even in a case where irregularities occur on the surfaces of the transparent electrode layers 153 and 163 due to the auxiliary interconnects 155 and 165, such irregularities become smooth. Therefore, in a case where the sealing member 180 is formed using a film formation method, a sealing defect is not likely to occur in the sealing member 180. Therefore, sealability of the sealing member 180 is improved.

Third Embodiment

Figure 18:
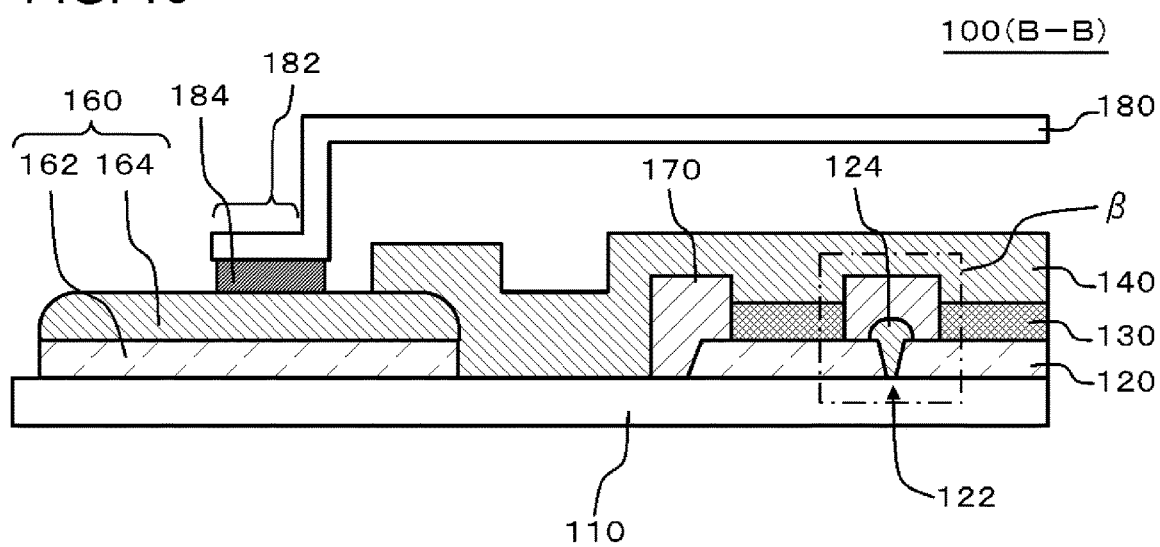
FIG. 18 is a cross-sectional view illustrating a configuration of a light-emitting device according to a third embodiment.

FIG. 18 is a cross-sectional view illustrating a configuration of a light-emitting device 100 according to a third embodiment, and corresponds to FIG. 6 in the first embodiment. The light-emitting device 100 according to the present embodiment has the same configuration as that of the light-emitting device 100 according to the first embodiment, except for the following points.

First, a plurality of grooves 122 are formed in the first electrode 120. The plurality of grooves 122 extend in parallel to each other. Each of the grooves 122 is formed when the first electrode 120 is form by selectively removing the transparent conductive film. The auxiliary electrode 124 is formed in each of the grooves 122. Specifically, the width of the groove 122 is equal to or greater than 10 μm and equal to or less than 100 μm. The groove 122 penetrates the first electrode 120. For this reason, the substrate 110 may be located on the bottom of the groove 122, and the lower portion of the auxiliary electrode 124 may be in contact with the substrate 110. The upper end of the auxiliary electrode 124 may be located above the upper surface of the first electrode 120, and may be located in the groove 122. The insulating layer 170 is formed over the groove 122 and the auxiliary electrode 124.

Figure 19:
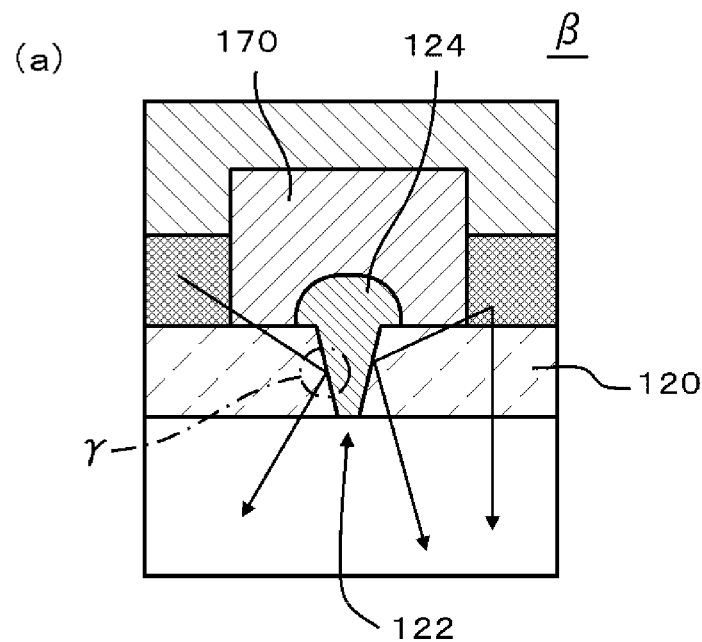
FIG. 19($a$) is an enlarged view of a region surrounded by a dotted line β of FIG. 18, and FIG. 19($b$) is an enlarged view of a region γ of FIG. 19($a$).
Figure 19:
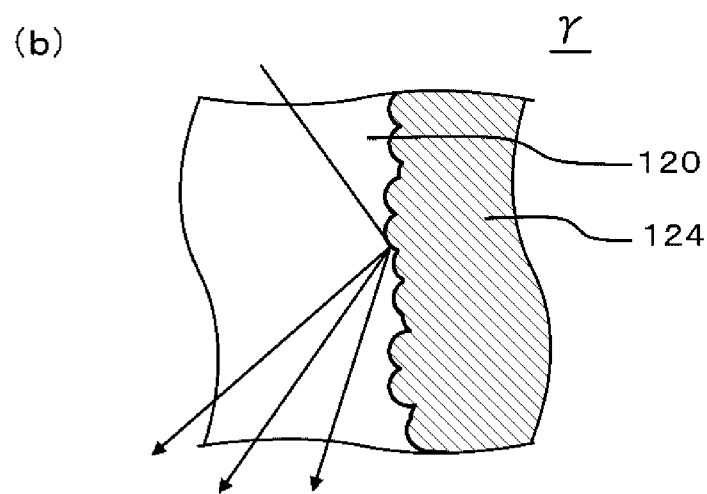

FIG. 19(a) is an enlarged view of a region surrounded by a dotted line β of FIG. 18. In the example shown in FIG. 19(a), the lateral side of the groove 122 is inclined in a direction in which the width of the groove 122 decreases toward the substrate 110. With such a configuration, light radiated at a shallow angle from the organic layer 130 is reflected from the lateral side of the auxiliary electrode 124, and is incident at an angle close to a right angle to the substrate 110. For this reason, the amount of the light radiated from the organic layer 130 which is reflected from the interface between the first electrode 120 and the substrate 110 is reduced. Therefore, the light extraction efficiency of the light-emitting device 100 is improved. Meanwhile, the lateral side of the groove 122 may be substantially at right angles to the substrate 110. However, in a case of being completely at right angles to the substrate 110, light which is totally reflected within the substrate 110 increases again, and emission efficiency is not improved, which leads to an undesirable result.

FIG. 19(b) is an enlarged view of a region γ in FIG. 19(a). The auxiliary electrode 124 is formed using a coating material. Metal particles are contained in the coating material. For this reason, a plurality of irregularities are formed on the lateral side of the auxiliary electrode 124. Therefore, light reflected from the auxiliary electrode 124 is directed to various directions. Thereby, the amount of the light radiated from the organic layer 130 which is reflected from the interface between the first electrode 120 and the substrate 110 is reduced. Therefore, the light extraction efficiency of the light-emitting device 100 is improved.

Since the auxiliary electrode 124 is formed using a coating material, the width of the auxiliary electrode 124 has a tendency to increase. On the other hand, according to the present embodiment, a coating material for constituting the auxiliary electrode 124 is applied inside the groove 122. Therefore, the width of the auxiliary electrode 124 can be set to the width of the groove 122. Thereby, it is possible to reduce the width of the auxiliary electrode 124.

Modification Example of Third Embodiment

Figure 20:
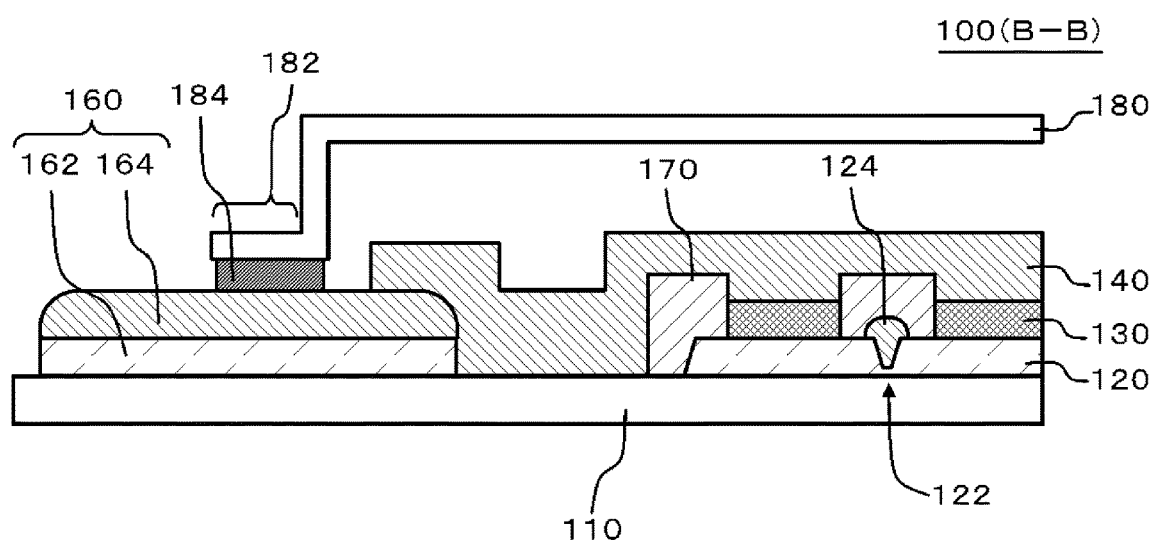
FIG. 20 is a cross-sectional view of a light-emitting device according to a modification example of the third embodiment.

FIG. 20 is a cross-sectional view of a light-emitting device 100 according to a modification example of the third embodiment, and corresponds to FIG. 18 of the third embodiment. The light-emitting device 100 according to the present modification example has the same configuration as that of the light-emitting device 100 according to the third embodiment, except that the groove 122 does not penetrate the first electrode 120. In the present modification example, the groove 122 is formed in a separate step from, for example, a step of forming the first electrode 120 by etching the transparent electrode material. However, there may be a case where the formation thereof can be performed in the same step as that in which the first electrode 120 is formed, depending on the width of the groove 122.

In the present modification example, it is also possible to reduce the width of the auxiliary electrode 124. In addition, the bottom of the auxiliary electrode 124 is in contact with the first electrode 120. Therefore, in a case where adhesiveness between the auxiliary electrode 124 and the substrate 110 is not satisfactory, it is possible to improve the adhesiveness of the auxiliary electrode 124 to the underlying base.

As described above, although the embodiments and modification examples of the present invention have been set forthwith reference to the accompanying drawings, they are merely illustrative of the present invention, and various configurations other than those stated above can be adopted.

The invention claimed is:

1. A light-emitting device comprising:
  a substrate;
  a first electrode, formed over the substrate, and comprising
    a transparent conductive material;
  an auxiliary electrode formed over the first electrode;
  an insular conductive portion formed over the first electrode and formed of the same material as that of the auxiliary electrode;
  an insulating layer comprising a plurality of openings and a portion that covers the auxiliary electrode and the insular conductive portion, and a continuous width of the portion of the insulating layer that covers the auxiliary electrode and the insular conductive portion is more than twice a width of the auxiliary electrode;
  an organic layer formed over the first electrode; and
  a second electrode formed over the organic layer.

2. The light-emitting device according to claim 1, wherein the auxiliary electrode is formed of a coating material including a metal particle.

3. The light-emitting device according to claim 2, wherein an area of the insular conductive portion is equal to or less than 50 μm2.

4. The light-emitting device according to claim 3, further comprising a plurality of the insular conductive portions, wherein one or more of the insular conductive portions are not covered with the insulating layer, and at least a surface layer of the insular conductive portion located outside the insulating layer is insulated or increased in resistance.

5. The light-emitting device according to claim 4, wherein a plurality of the auxiliary electrodes extend in parallel to each other, and a density of the insular conductive portion at a halfway point of the plurality of auxiliary electrodes is lower than a density of the insular conductive portion in a region adjacent to the auxiliary electrode.

6. The light-emitting device according to claim 5, wherein the metal particle is a silver particle.

7. The light-emitting device according to claim 1, wherein a distance from a center of the auxiliary electrode to an edge of the insulating layer is equal to or greater than 40 µm and equal to or less than 60 µm, in a width direction of the auxiliary electrode.

8. The light-emitting device according to claim 1, wherein each of the plurality of openings overlaps with the first electrode, the organic layer, and the second electrode.

* * * * *